(12) United States Patent
Kang et al.

(10) Patent No.: US 10,431,643 B2
(45) Date of Patent: Oct. 1, 2019

(54) DISPLAY PANEL

(71) Applicant: Samsung Display Co., Ltd., Yongin-Si, Gyeonggi-Do (KR)

(72) Inventors: Ki-Nyeng Kang, Seoul (KR); Sun-Kwang Kim, Suwon-si (KR); Joo-Sun Yoon, Seoul (KR); Jong-Hyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/364,776

(22) Filed: Nov. 30, 2016

(65) Prior Publication Data

US 2017/0207289 A1 Jul. 20, 2017

(30) Foreign Application Priority Data

Jan. 14, 2016 (KR) ........................ 10-2016-0004479

(51) Int. Cl.
*H01L 27/32* (2006.01)
*H01L 51/52* (2006.01)
*H01L 51/56* (2006.01)

(52) U.S. Cl.
CPC ........ *H01L 27/3276* (2013.01); *H01L 27/326* (2013.01); *H01L 27/3246* (2013.01); *H01L 27/3262* (2013.01); *H01L 27/3265* (2013.01); *H01L 51/5203* (2013.01); *H01L 51/56* (2013.01); *H01L 2251/5323* (2013.01)

(58) Field of Classification Search
CPC ............ H01L 27/3276; H01L 27/3246; H01L 27/3262; H01L 27/3265; H01L 51/5203; H01L 51/56
See application file for complete search history.

(56) References Cited

U.S. PATENT DOCUMENTS

| | | | |
|---|---|---|---|
| 6,864,638 B2 * | 3/2005 | Ishihara | H01L 27/3276 257/59 |
| 7,068,342 B1 * | 6/2006 | Lee | G02F 1/13394 349/155 |
| 7,855,758 B2 * | 12/2010 | Kim | G02F 1/136213 257/71 |
| 8,022,900 B2 * | 9/2011 | Koh | H01L 27/3276 315/505 |
| 8,154,199 B2 * | 4/2012 | Ozawa | G09G 3/3266 313/498 |
| 8,399,274 B2 | 3/2013 | Kang et al. | |
| 9,780,121 B2 * | 10/2017 | Watanabe | H01L 27/124 |
| 2006/0268211 A1 * | 11/2006 | Chen | G02F 1/134363 349/141 |
| 2007/0164286 A1 * | 7/2007 | Kim | G02F 1/136227 257/59 |

(Continued)

FOREIGN PATENT DOCUMENTS

KR 20090131903 A * 12/2009

*Primary Examiner* — Ida M Soward
(74) *Attorney, Agent, or Firm* — Cantor Colburn LLP

(57) ABSTRACT

A display panel includes a signal line extending in a first direction and/or a second direction crossing the first direction, a first transistor electrically connected to the signal line, and including a first active pattern and a first gate electrode, and a first electrode electrically connected to the first transistor. A plurality of openings is defined in the signal line in way such that the signal line transmits an external light therethrough.

16 Claims, 19 Drawing Sheets

(56) References Cited

U.S. PATENT DOCUMENTS

| | | | | |
|---|---|---|---|---|
| 2007/0176538 A1* | 8/2007 | Winters | ............... | H01L 27/3276 |
| | | | | 313/504 |
| 2009/0315451 A1* | 12/2009 | Choi | ................... | H01L 27/3276 |
| | | | | 313/504 |
| 2010/0052517 A1* | 3/2010 | Kim | ................... | H01L 27/3265 |
| | | | | 313/504 |
| 2011/0304604 A1* | 12/2011 | Jo | ........................ | G09G 3/3677 |
| | | | | 345/212 |
| 2012/0306864 A1* | 12/2012 | Inoue | ................. | G02B 27/2214 |
| | | | | 345/419 |
| 2013/0240914 A1* | 9/2013 | Jin | ...................... | H01L 27/3246 |
| | | | | 257/88 |
| 2013/0302923 A1* | 11/2013 | Park | ................... | H01L 27/1218 |
| | | | | 438/29 |
| 2014/0043312 A1* | 2/2014 | Kim | ..................... | G09G 3/3614 |
| | | | | 345/209 |
| 2015/0014650 A1 | 1/2015 | Lim et al. | | |
| 2015/0036269 A1* | 2/2015 | Kim | .................... | H01L 51/5246 |
| | | | | 361/679.01 |
| 2015/0311260 A1* | 10/2015 | Senda | ................... | H01L 51/5253 |
| | | | | 257/40 |
| 2016/0049451 A1* | 2/2016 | Lim | ..................... | H01L 27/124 |
| | | | | 257/40 |
| 2016/0188083 A1* | 6/2016 | Shi | ......................... | G06F 3/044 |
| | | | | 345/174 |
| 2017/0373093 A1* | 12/2017 | Namkung | ........... | H01L 27/1218 |
| 2018/0122954 A1* | 5/2018 | Kim | .................. | H01L 29/78618 |

\* cited by examiner

DISPLAY PANEL

This application claims priority to Korean Patent Application No. 10-2016-0004479, filed on Jan. 14, 2016, and all the benefits accruing therefrom under 35 U.S.C. § 119, the content of which in its entirety is herein incorporated by reference.

BACKGROUND

1. Field

Exemplary embodiments of the inventive concept relate to a display panel and a method of manufacturing the display panel. More particularly, exemplary embodiments of the inventive concept relate to a display panel for a transparent display apparatus and a method of manufacturing the display panel.

2. Description of the Related Art

A display device displays an image using a pixel that emits light. An organic light emitting display device includes the pixel having an organic light emitting diode ("OLED"). The OLED emits the light of which a wavelength thereof depends on an organic material included in the OLED. For example, the OLED may include a predetermined organic material such that the OLED emits one of a red color light, a green color light and a blue color light. The organic light emitting display device displays the image by mixing lights emitted by organic materials of a plurality of OLEDs.

A transparent organic light emitting display apparatus has been developed by which an image is displayed and external light passes therethrough. The transparent display apparatus may transmit external light incident to a front surface thereof, so that an object disposed behind the transparent organic light emitting display apparatus is viewable to a user.

SUMMARY

Transparency of a transparent organic light emitting display apparatus may be determined by transmittance of the external light therethrough. However, elements for displaying the image which are included within the transparent organic light emitting display apparatus may cause a decrease in the transmittance of the external light therethrough.

One or more exemplary embodiment of the inventive concept provides a transparent organic light emitting display apparatus with improved transmittance of an external light.

One or more exemplary embodiments of the inventive concept also provide a method of manufacturing the transparent organic light emitting display apparatus According to an exemplary embodiment of the inventive concept, a display panel includes a signal line extending in a first direction, a first transistor electrically connected to the signal line, and including a first active pattern and a first gate electrode, and a first electrode electrically connected to the first transistor. In such an embodiment, a plurality of openings is defined in the signal line in a way such that the signal line transmits an external light therethrough.

In an exemplary embodiment, the signal line may include a gate line extending in the first direction, a data line extending in a second direction which crosses the first direction, and a driving power supply line extending in the second direction and spaced apart from the data line.

In an exemplary embodiment, each of the gate line, the data line and the driving power supply line may have a mesh structure which defines the openings.

In an exemplary embodiment, the mesh structure may be defined by a plurality of fine lines which make repeated X shapes.

In an exemplary embodiment, the fine lines may have a width less than about 2.0 micrometers (μm).

In an exemplary embodiment, the first gate electrode may be electrically connected to the gate line. In such an embodiment, the openings may not be at the first gate electrode, so that the first gate electrode blocks the external light.

In an exemplary embodiment, the first electrode may include a transparent conductive material, and a portion of the first electrode may overlap the signal line.

In an exemplary embodiment, the first active pattern may include an oxide semiconductor which is transparent.

In an exemplary embodiment, the display panel may further include a first storage electrode and a second storage electrode which form a storage capacitor. In such an embodiment, the first storage electrode may include the oxide semiconductor which is transparent, and the second storage electrode may include a transparent conductive material.

In an exemplary embodiment, the first storage electrode and the active pattern may be defined by a same layer, and each of the first storage electrode and the active pattern may have a hydrogen concentration higher than a hydrogen concentration of the first active pattern.

In an exemplary embodiment, the display panel may further include an insulation layer including an organic material and between the first storage electrode and the second storage electrode.

In an exemplary embodiment, the display panel may further include a first insulation layer and a second insulation layer, which are between the first storage electrode and the second storage electrode. In such an embodiment, the first insulation layer may include an inorganic material, and the second insulation layer may include an organic material.

In an exemplary embodiment, the second storage electrode and the first electrode may be defined by a same layer.

In an exemplary embodiment, the display panel may further include a pixel defining layer on the first electrode and including a transparent material, where an opening which exposes a portion of the first electrode is defined in the pixel defining layer.

In an exemplary embodiment, the display panel may further include a plurality of insulation layers which insulates the signal line, the first transistor and the first electrode from each other. In such an embodiment, the signal line, the first transistor and the first electrode may be electrically connected to each other through contact holes defined through the insulation layers. In such an embodiment, the openings may not be at a portion of the signal line and the first transistor where the signal line and the first transistor are connected through the contact hole, and may not be formed at a portion of the transistor and the first electrode where the transistor and the first electrode are connected through the contact hole, such that the portion of the signal line and the first transistor and the portion of the transistor and the first electrode are not transparent.

According to an exemplary embodiment of the inventive concept, a method of manufacturing a display panel includes providing a signal line on a base substrate, providing an insulation layer on the base substrate on which the signal line is provided, and providing a transparent pattern on the insulation layer. In such an embodiment, the providing the signal line includes forming a plurality of openings in the signal line in a way such that the signal line transmits an external light therethrough.

In an exemplary embodiment, the providing the signal line may further include providing a conductive layer on the base substrate, and forming the signal line by patterning the conductive layer using a photo lithography method or an imprint lithography method. In such an embodiment, the openings may be simultaneously formed in the signal line when the signal line is patterned.

In an exemplary embodiment, the insulation layer may include an organic material, and the method may further include providing an active pattern on the base substrate, and cleaning the insulation layer using a cleaning fluid including hydrogen before the providing the transparent pattern. In such an embodiment, the active pattern may include an oxide semiconductor which is transparent, the transparent pattern may include a first electrode and a second storage electrode, and the first storage electrode, the insulation layer and the second storage electrode may collectively define a storage capacitor.

In an exemplary embodiment, the method may further include providing a pixel defining layer including a transparent material on the first electrode, where an opening which exposes a portion of the first electrode may be defined in the pixel defining layer. In such an embodiment, the transparent pattern may not overlap the first active pattern, and the second storage electrode may overlap the first storage electrode.

According to an exemplary embodiment of the inventive concept, a display panel includes a signal line including a metal, a first electrode including a transparent conductive material and electrically connected to the signal line, and a light emitting structure on the first electrode. In such an embodiment, a plurality of openings is defined in the signal line in a way such that the signal line transmits an external light therethrough.

According to exemplary embodiments of the inventive concept, a display panel includes signal lines in which a plurality of openings is defined, such that transparency may be improved. In such embodiments, the display panel may include a first storage electrode including an oxide semiconductor which is transparent and include a second storage electrode which includes a transparent pattern such that transmittance of an external light corresponding to where a storage capacitor is formed is substantially improved.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
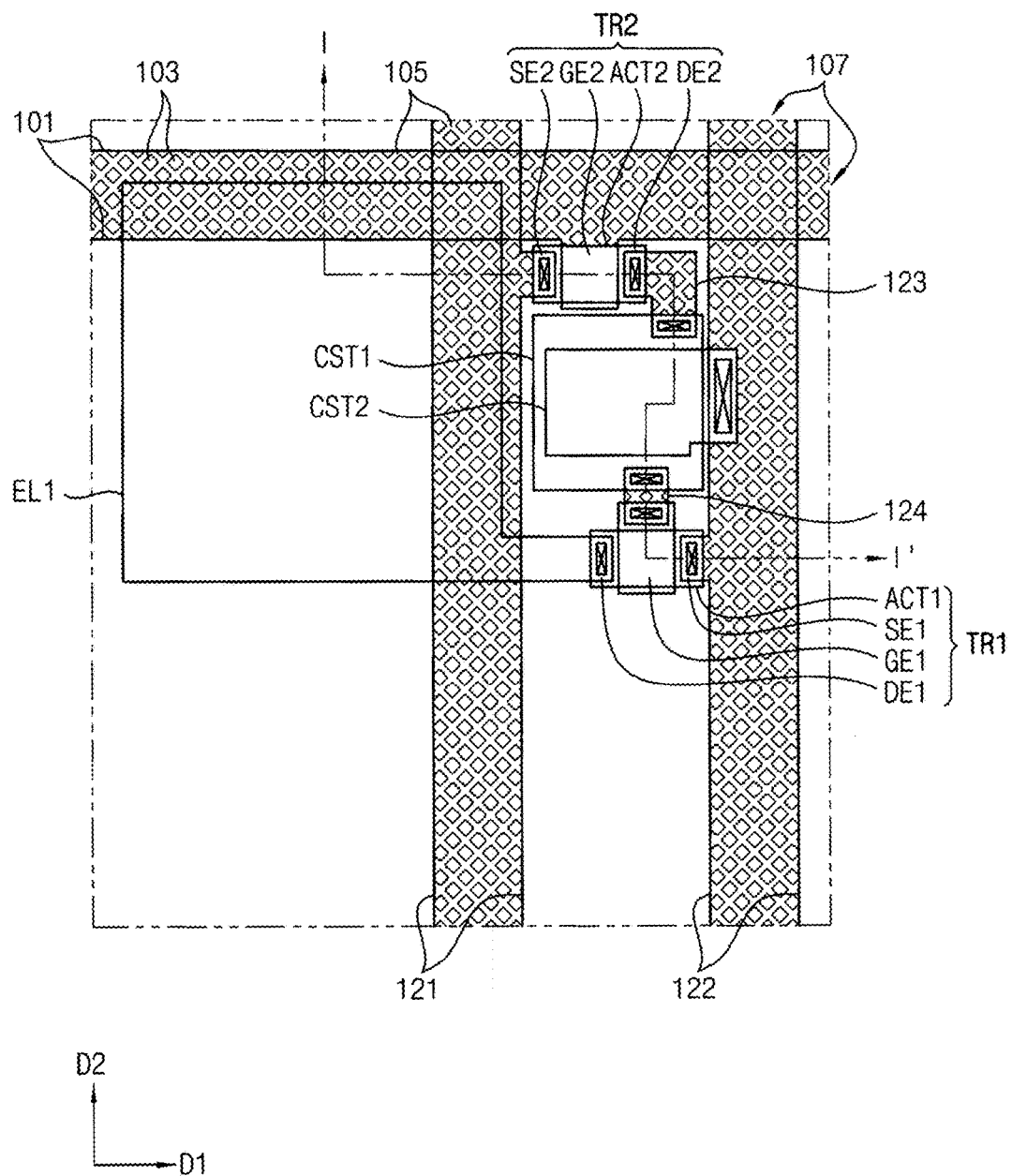
FIG. 1 is a plan view illustrating a display panel according to an exemplary embodiment of the inventive concept.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the inventive concept will be described in detail with reference to the accompanying drawings.

Figure 2:
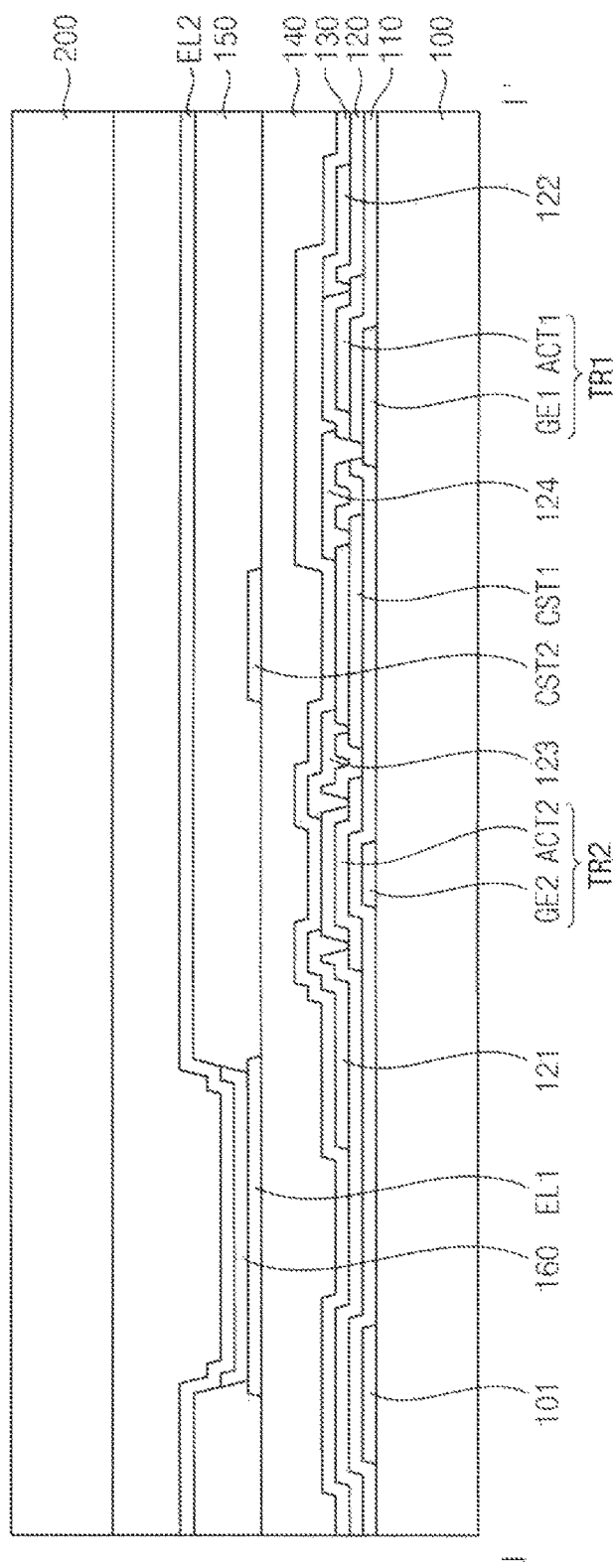
FIG. 2 is a cross-sectional view taken along line I-I' of FIG. 1.
Figure 4:
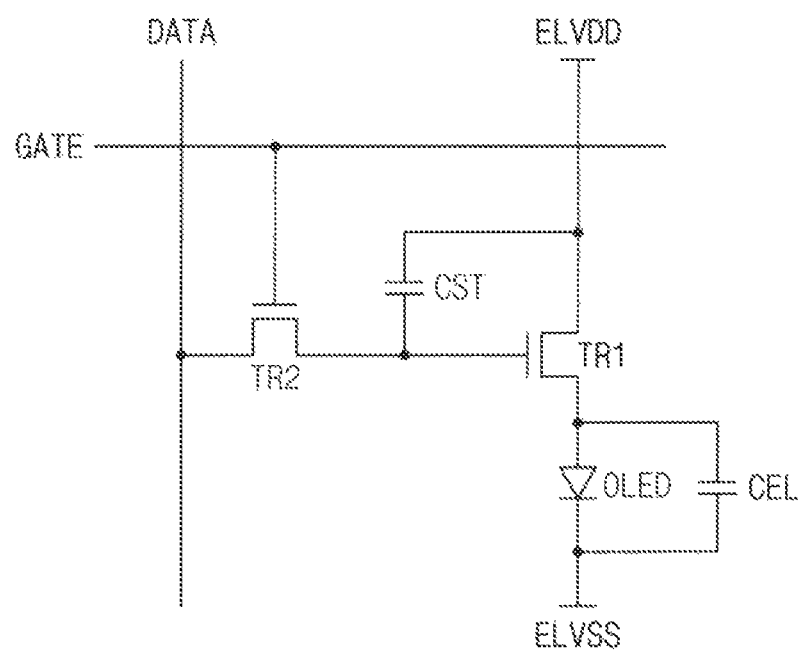
FIG. 4 is an equivalent circuit diagram illustrating an exemplary embodiment of a pixel of the display panel of FIG. 1.

FIG. 1 is a plan view illustrating a display panel according to an exemplary embodiment of the inventive concept. FIG. 2 is a cross-sectional view taken along line I-I' of FIG. 1. FIG. 4 is an equivalent circuit diagram illustrating an exemplary embodiment of a pixel of the display panel of FIG. 1

Referring to FIGS. 1 and 2, an exemplary embodiment of the display panel may include a base substrate 100, a gate pattern, a first insulation layer 110, an active pattern, a second insulation layer 120, a data pattern, first and second transistors TR1 and TR2, a third insulation layer 130, a fourth insulation layer 140, a transparent pattern, a pixel defining layer 150, a light emitting structure 160, a second electrode EL2 and a sealing substrate 200.

The base substrate 100 may be a transparent insulation substrate. In one exemplary embodiment, for example, the base substrate 100 may include a glass, quartz, a transparent resin, or the like. The transparent resin for the base substrate 10 may include polyimide-based resin, acryl-based resin, polyacrylate-based resin, polycarbonate-based resin, polyether-based resin, sulfonic acid containing resin, polyethyleneterephthalate-based resin, or the like.

The gate pattern may be disposed on the base substrate 100. The gate pattern may include a metal, an alloy, a conductive metal oxide or a transparent conductive material, for example. In one exemplary embodiment, for example, the gate pattern may be formed using at least one material selected from aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide ("ITO"), tin oxide (SnOx), indium oxide (InOx), gallium oxide (GaOx), and indium zinc oxide ("IZO"). In such an embodiment, the material listed above may be used alone or in a combination thereof. In exemplary embodiments, the gate pattern may have a single layer structure or a multi-layer structure, which may include a metal film, an alloy film, a metal nitride film, a conductive metal oxide film and/or a transparent conductive film.

The gate pattern may include a gate line 101, a first gate electrode GE1 and a second gate electrode GE2.

The gate line 101 may extend in a first direction D1. A scan signal may be provided to the second gate electrode GE2 through the gate line 101. The gate line 101 may transmit an external light. In an exemplary embodiment, a plurality of openings may be defined or formed at substantially an entire region of the gate line 101. In one exemplary embodiment, for example, the gate line 101 may include a plurality of fine lines disposed in a way, such that the fine lines may form repeated X shapes to define a mesh structure. The fine lines may have a width less than about 2.0 micrometers (μm) to be invisible to a user. Accordingly, the gate line 101 in the mesh structure may effectively transmit the external light through the openings.

In an exemplary embodiment, the gate line 101 may have the fine lines which form the mesh structure as described above, but not being limited thereto. In an alternative exemplary embodiment, the gate line 101 may have various configurations to transmit the external light. In one exemplary embodiment, for example, the gate line 101 may include a plurality of slits. In an exemplary embodiment, the openings in the gate line 101 may have rectangular, round or oval shapes. The openings may be arranged regularly or irregularly.

The first gate electrode GE1 may be spaced apart from the gate line 101. The first gate electrode GE1 may have a conventional shape, in which no opening is defined, to improve characteristics of the first transistor TR1. Accordingly, the first gate electrode GE1 may not transmit the external light.

The second gate electrode GE2 may be electrically connected to the gate line 101. The second gate electrode GE2 may have a conventional shape, in which no opening is defined, to improve characteristics of the second transistor TR2. Accordingly, the second gate electrode GE2 may not transmit the external light.

Although not shown in figures, a buffer layer may be further disposed between the gate pattern and the base substrate 100. The buffer layer may effectively prevent diffusion of metal atoms and/or impurities from the base substrate 100. In an exemplary embodiment, where the base substrate 100 has a relatively irregular or uneven surface, the buffer layer may improve flatness of the surface of the base substrate 100. The buffer layer may be formed using a silicon compound. In one exemplary embodiment, for example, the buffer layer may include at least one material selected from silicon oxide (SiOx), silicon nitride (SiNx), silicon oxynitride (SiOxNy), silicon oxycarbide (SiOxCy), and silicon carbon nitride (SiCxNy). In such an embodiment, the materials listed above may be used alone or in a mixture thereof. The buffer layer may have a single layer structure or a multi-layer structure. In one exemplary embodiment, for example, the buffer layer may have a single-layered structure including a silicon oxide film, a silicon nitride film, a silicon oxynitride film, a silicon oxycarbide film or a silicon carbon nitride film. Alternatively, the buffer layer may have a multilayered structure including at least two of a silicon oxide film, a silicon nitride film, a silicon oxynitride film, a silicon oxycarbide film and a silicon carbon nitride film, for example.

The first insulation layer 110 may be disposed on the base substrate 100 on which the gate pattern is disposed. The first insulation layer 110 may include a silicon compound, metal oxide, etc. In one exemplary embodiment, for example, the first insulation layer 110 may be formed using at least one material selected from silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx) and titanium oxide (TiOx). In such an embodiment, the materials listed above may be used alone or in a combination thereof. In exemplary embodiments, the first insulation layer 110 may be uniformly formed on the base substrate 100 along a profile of the gate pattern. In such an embodiment, the first insulation layer 110 may have a substantially small thickness, such that a stepped portion may be formed at a portion of the first insulation layer 110 adjacent to the gate pattern. In some exemplary embodiments, the first insulation layer 110 may have a relatively large thickness for sufficiently covering the gate pattern, so that the first insulation layer 110 may have a substantially flat surface.

The active pattern may be disposed on the first insulation layer 110. The active pattern may include an oxide semiconductor which is transparent. In one exemplary embodiment, for example, the oxide semiconductor may include an amorphous oxide including at least one selected from indium (In), zinc (Zn), gallium (Ga), tin (Sn) and hafnium (Hf). In one exemplary embodiment, for example, the oxide semiconductor may include or be consist of an amorphous oxide including indium (In), zinc (Zn) and gallium (Ga), or an amorphous oxide including indium (In), zinc (Zn) and hafnium (Hf). The oxide semiconductor may include an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO).

The active pattern may include a first active pattern ACT1, a second active pattern ACT2 and a first storage electrode CST1.

The first active pattern may overlap the first gate electrode GE1 when viewed in a thickness direction of the display panel. The second active pattern ACT2 may overlap the second gate electrode GE2 when viewed in the thickness direction of the display panel.

The first storage electrode CST1 may be spaced apart from the first active pattern ACT1 and the second active pattern ACT2. The first storage electrode CST1 may have a hydrogen concentration higher than that of the first active pattern ACT1 and the second active pattern ACT2. When the hydrogen concentration is increased, carrier concentration increases, so that the first storage electrode CST1 may have a high hydrogen concentration to be effectively used as a lower electrode of a storage capacitor.

In an exemplary embodiment, where the first and second active patterns ACT1 and ACT2 includes oxide semiconductor, the display panel may further include a light blocking layer overlapping the first and second active patterns ACT1 and ACT2 to effectively prevent degradation of characteristics of the oxide semiconductor due to an external light.

The second insulation layer 120 may be disposed on the first insulation layer 110 on which the active pattern is disposed. The second insulation layer 120 may include a silicon compound, a metal oxide, or the like. In one exemplary embodiment, for example, the second insulation layer 120 may be formed using at least one material selected from silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx) and titanium oxide (TiOx). In such an embodiment, the materials listed above may be used alone or in a combination thereof. In exemplary embodiments, the second insulation layer 120 may be uniformly formed on the first insulation layer 110 along a profile of the active pattern. In an exemplary embodiment, the second insulation layer 120 may have a substantially small thickness, such that a stepped portion may be formed at a portion of the second insulation layer 120 adjacent to the active pattern. In some exemplary embodiments, the second insulation layer 120 may have a relatively large thickness for sufficiently covering the gate pattern, so that the second insulation layer 120 may have a substantially level surface.

The data pattern may include a data line 121, a second source electrode SE2, a second drain electrode DE2, a first connecting electrode 123, a driving power supply line 122, a first source electrode SE1, and a second connecting electrode 124. In some example embodiment, the second active pattern ACT2 and the first storage electrode CST1 may be directly connected to each other without the first connecting electrode 123.

The data line 121 may extend in a second direction D2 which crosses the first direction D1. A data signal may be applied to the second source electrode SE2 through the data line 121. The data line 121 may transmit the external light. In one exemplary embodiment, for example, a plurality of openings may be defined or formed at substantially an entire region of the data lien 121. The data line 121 may include a plurality of fine lines, so that the fine lines may form repeated X shapes to define a mesh structure. The fine lines may have a width less than about 2.0 μm to be invisible to a user. Accordingly, the data line 121 may effectively transmit the external light through the openings.

In an exemplary embodiment, the data line 121 has the fine lines which form the mesh structure as described above, but not being limited thereto. In an alternative exemplary embodiment, the data line 121 may have various configurations to transmit the external light. In one exemplary embodiment, for example, the data line 121 may include a plurality of slits. In an exemplary embodiment, the openings in the data line 121 may have rectangular, round or oval shapes. The openings may be arranged regularly or irregularly.

The second source electrode SE2 may be electrically connected to the data line 121. The second source electrode SE2 may be electrically connected to the second active pattern ACT2 through a contact hole defined or formed through the second insulation layer 120. The second source electrode SE2 may have a conventional shape, in which no opening is defined, to improve characteristics of the second transistor TR2. Accordingly, the second source electrode SE2 may not transmit the external light.

The second drain electrode DE2 may be electrically connected to the second active pattern ACT2 through a contact hole defined or formed through the second insulation layer 120. The second drain electrode DE2 may be electrically connected to the first connecting electrode 123. The second drain electrode DE2 may have a conventional shape, in which no opening is defined, to improve characteristics of the second transistor TR2. Accordingly, the second drain electrode DE2 may not transmit the external light.

The first connecting electrode 123 may electrically connect the second drain electrode DE2 to the first storage electrode CST1. The first connecting electrode 123 may be electrically connected to the second drain electrode DE2. The first connecting electrode 123 may be electrically connected to the first storage electrode CST1 through a contact hole defined or formed through the second insulation layer 120.

A portion of the first connecting electrode 123 which fills the contact holes may have a conventional shape, in which no opening is defined, to improve electrical characteristics. Accordingly, the portion may not transmit the external light. In such an embodiment, another portion of the first connecting electrode 123 may have a mesh structure similar to the data line 121, so that the external light may be transmitted therethrough.

The driving power supply line 122 may be spaced apart from the data line 121 in the first direction D1, and extended in the second direction D2. A first power voltage ELVDD (shown in FIG. 4) may be applied to the first source electrode SE1 through the driving power supply line 122. The driving power supply line 122 may transmit the external light. In one exemplary embodiment, for example, a plurality of openings may be defined or formed at substantially an entire region of the driving power supply line 122. The driving power supply line 122 may include a plurality of fine lines, so that the fine lines may form repeated X shapes to define a mesh structure. The fine lines may have a width less than about 2.0 µm to be invisible to users. Accordingly, the driving power supply line 122 may transmit the external light through the openings.

In an exemplary embodiment, the driving power supply line 122 has the fine lines which form the mesh structure as described above, but not being limited thereto. In an alternative exemplary embodiment, the driving power supply line 122 may have various configurations to transmit the external light. In one exemplary embodiment, for example, the driving power supply line 122 may include a plurality of slits. In an exemplary embodiment, the openings in the driving power supply line 122 may have rectangular, round or oval shapes. The openings may be arranged regularly or irregularly.

The first source SE1 may be electrically connected to the first active pattern ACT1 through a contact hole defined or formed through the second insulation layer 120. The first source SE1 may have a conventional shape, in which no opening is defined, to improve characteristics of the first transistor TR1. Accordingly, the first source SE1 may not transmit the external light.

The second connecting electrode 124 may electrically connect the first gate electrode GE1 to the first storage electrode CST1. The second connecting electrode 124 may be electrically connected to the first gate electrode GE1 through a contact hole defined or formed through the second insulation layer 120. The first connecting electrode 123 may be electrically connected to the first storage electrode CST1 through a contact hole defined or formed through the second insulation layer 120.

A portion of the second connecting electrode 124 which fills the contact holes may have a conventional shape, in which no opening is defined, to improve electrical characteristics. Accordingly, the portion may not transmit the external light. In such an embodiment, another portion of the second connecting electrode 124 may have a mesh structure similar to the data line 121, so that the external light may be transmitted therethrough.

The third insulation layer 130 may be disposed on the second insulation layer 120 on which the data pattern is disposed. The third insulation layer 130 may include a silicon compound, metal oxide, or the like. In one exemplary embodiment, for example, the third insulation layer 130 may be formed using at least one material selected from silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx) and titanium oxide (TiOx). In such an embodiment, the materials listed above may be used alone or in a combination thereof. In exemplary embodiments, the third insulation layer 130 may be uniformly formed on the base substrate 100 along a profile of the data pattern. In such an embodiment, the third insulation layer 130 may have a substantially small thickness, such that a stepped portion may be formed at a portion of the third insulation layer 130 adjacent to the data pattern. In some exemplary embodiments, the third insulation layer 130 may have a relatively large thickness for sufficiently covering the gate pattern, so that the third insulation layer 130 may have a substantially flat surface.

The first transistor TR1 may be defined by the first gate electrode GE1, the first active pattern ACT1, the first source electrode SE1 and the first drain electrode DE1.

The second transistor TR2 may be defined by the second gate electrode GE2, the second active pattern ACT2, the second source electrode SE2 and the second drain electrode DE2.

The fourth insulation layer 140 may be disposed on the third insulation layer 130. The fourth insulation layer 140 may have a single-layered structure or a multi-layered structure including at least two insulation films. The fourth insulation layer 140 may be formed using an organic material. In one exemplary embodiment, for example, the fourth insulation layer 140 may include at least one material selected from acryl-based resin and polyimide-based resin. In such an embodiment, the materials listed above may be used alone or in a combination thereof.

The transparent pattern may be disposed on the fourth insulation layer 140. The transparent pattern may include a transparent conductive material. In one exemplary embodiment, for example, the transparent pattern may include ITO or, IZO.

The transparent pattern may include a first electrode EL1, a second storage electrode CST2.

The first electrode EL1 may overlap a portion of the gate pattern and a portion of the data pattern when viewed in the thickness direction of the display panel. In one exemplary embodiment, for example, the first electrode EL1 may overlap a portion of the gate line 101, and overlap a portion of the data line 121. The first electrode EL1 may include a transparent conductive material. In an exemplary embodiment, the first electrode EL1 includes the transparent conductive material, and the gate line 101 and the data line 121 have the mesh structure which transmit the external light therethrough, so that the external light may be effectively transmitted although the first electrode EL1 overlaps the gate line 101 or the data line 121.

The first drain electrode DE1 may be electrically connected to the first active pattern ACT1 through a contact hole which is defined or formed through the first to fourth insulation layers 120, 130 and 140. The first drain electrode DE1 may be electrically connected to the first electrode EL1. The first drain electrode DE1 may be defined by a portion of the first electrode EL1.

In some exemplary embodiment, the first drain electrode DE1 may be formed as the data pattern, and electrically connected to the first active pattern ACT1 through a contact hole defined or formed through the second insulation layer 120. The first electrode EL1 may be electrically connected to the first drain electrode DE1 through a contact hole defined or formed through the third and fourth insulation layers 130 and 140.

The second storage electrode CST2 may overlap the first storage electrode CST1 when viewed in the thickness direction of the display panel. The second storage electrode CST2 may be electrically connected to the driving power supply line 122 through a contact hole defined or formed through the third and fourth insulation layers 130 and 140. The first and second storage electrode CST1 and CST2 and the second to fourth insulation layers 120, 130 and 140 between the first and second storage electrode CST1 and CST2 may collectively define the storage capacitor.

In an exemplary embodiment, the first and second storage electrodes CST1 and CST2 and the second to fourth insulation layers 120, 130 and 140 between the first and second storage electrodes collectively define the storage capacitor as described above, but note being limited thereto. In an alternative exemplary embodiment, at least one of the second to fourth insulation layers between the first and second storage electrodes CST1 and CST2 may be omitted to reduce a gap between the first and second storage electrodes CST1 and CST2. In such an embodiment, capacitance of the storage capacitor may be increased.

In an exemplary embodiment, a portion of the driving power supply line 122 which fills the contact holes may have a conventional shape, in which no opening is defined, to improve electrical characteristics. Accordingly, the portion may not transmit the external light.

The pixel defining layer 150 may be disposed on the fourth insulation layer 140 on which the first electrode EL1 is disposed. The pixel defining layer 150 may include an organic material or an inorganic material. In one exemplary embodiment, for example, the pixel defining layer 150 may be formed using at least one material selected from photoresist, acryl-based resin, polyacryl-based resin, polyimide-based resin and a silicon compound. In some exemplary embodiment, an opening to expose a portion of the first electrode EL1 may be formed by etching the pixel defining layer 150. A display area and a non-display area of the display apparatus may be determined by the opening of the pixel defining layer 150. In one exemplary embodiment, for example, the display area may correspond to the opening of the pixel defining layer 150, and the non-display area may correspond to a portion of the pixel defining layer 150 adjacent to the opening.

The pixel defining layer 150 may include a transparent material, so that the pixel defining layer 150 may transmit the external light. Thus, the non-display area may transmit the external light.

The light emitting structure 160 may be disposed on the first electrode EL1 which is exposed by the pixel defining layer 160. The light emitting structure 160 may extend on a sidewall of the opening of the pixel defining layer 150. The light emitting structure 160 may be formed by a laser induced thermal imaging process or a printing process, for example. The light emitting structure 160 may include an organic light emitting layer ("EL"), a hole injection layer ("HIL"), a hole transfer layer ("HTL"), an electron transfer layer ("ETL") or an electron injection layer ("EIL"), for example. In exemplary embodiments, a plurality of organic light emitting layers may be formed using light emitting materials for generating different colors of light such as a red color of light (R), a green color of light (G) and a blue color of light (B) in accordance with color pixels of the display device. In some exemplary embodiments, the organic light emitting layer of the of the light emitting structure 160 may include a plurality of stacked light emitting materials for generating a red color of light, a green color of light and a blue color of light to thereby emitting a white color of light. In such an embodiment, the display panel may further include a color filter layer to emit color lights different from each other.

In an exemplary embodiment, the light emitting structure 160 and the first electrode EL1 are disposed between the data line 121 and a driving power supply line of an adjacent pixel, but not being limited thereto. In some exemplary embodiments, the first electrode EL1 and the light emitting structure 160 may be disposed between the data line 121 and the driving power supply line 122. In such an embodiment, a position of the data line 121 may be variously changed.

The second electrode EL2 may be disposed on the pixel defining layer 150 and the light emitting structure 160. A second power voltage ELVSS (shown in FIG. 4) may be applied to the second electrode EL2. The second electrode EL2 may transmit light. The second electrode EL2 may be formed using a metal, an alloy, a metal nitride, a conductive metal oxide, a transparent conductive material, or the like. In one exemplary embodiment, for example, the second electrode EL2 may include at least one material selected from aluminum (Al), alloy containing aluminum, aluminum nitride (AlNx), silver (Ag), alloy containing silver, tungsten (W), tungsten nitride (WNx), copper (Cu), alloy containing copper, nickel (Ni), chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), ITO, tin oxide (SnOx), indium oxide (InOx), gallium oxide (GaOx) and IZO. In such an embodiment, the materials listed above may be used alone or in a combination thereof. In an exemplary embodiment, the second electrode EL2 may have a single layer structure or a multi-layer structure, which may include a metal film, an alloy film, a metal nitride film, a conductive metal oxide film and/or a transparent conductive material film.

The sealing substrate 200 may be disposed on the second electrode EL2. The sealing substrate 200 may include a transparent material and be configured to effectively prevent ambient air and moisture from permeating into the transparent organic light emitting display apparatus. The sealing substrate 200 may be combined to the base substrate 100 to seal space between the base substrate 100 and the sealing substrate 200 by a sealing agent (not shown).

A desiccant or a filler may be filled into the space. In an exemplary embodiment, a thin sealing film instead of the sealing substrate 200 may be formed on the second electrode EL2 to protect the second electrode and the light emitting structure form ambient air and moisture. The sealing film has a structure in which a layer including or formed of an inorganic material such as silicon oxide or silicon nitride and a layer including or formed of such as epoxy or polyimide are alternately stacked. However, the invention is not limited thereto. In such an embodiment, the structure of the sealing film may be one of any sealing structure in the form of a transparent thin film.

According to an exemplary embodiment, the elements of the display apparatus may transmit the external light except for the first and second transistor TR1 and TR2 and portions where the contact holes are formed. Thus, transmittance of the external light may be increased, so that quality as a transparent display apparatus may be improved. In such an embodiment, quality degradation on a transmitted light image due to a diffraction phenomenon may be reduced.

In an exemplary embodiment, as shown in FIG. 2, the first and second transistors may have a bottom gate structure, but not being limited thereto. In an alternative exemplary embodiment, the first and second transistors may have another structure such as top gate structure and so on. In an exemplary embodiment, a pixel structure of the display panel may have various structures. In an exemplary embodiment, the first to fourth insulation layers may be omitted or partially removed as desired.

Figure 3:
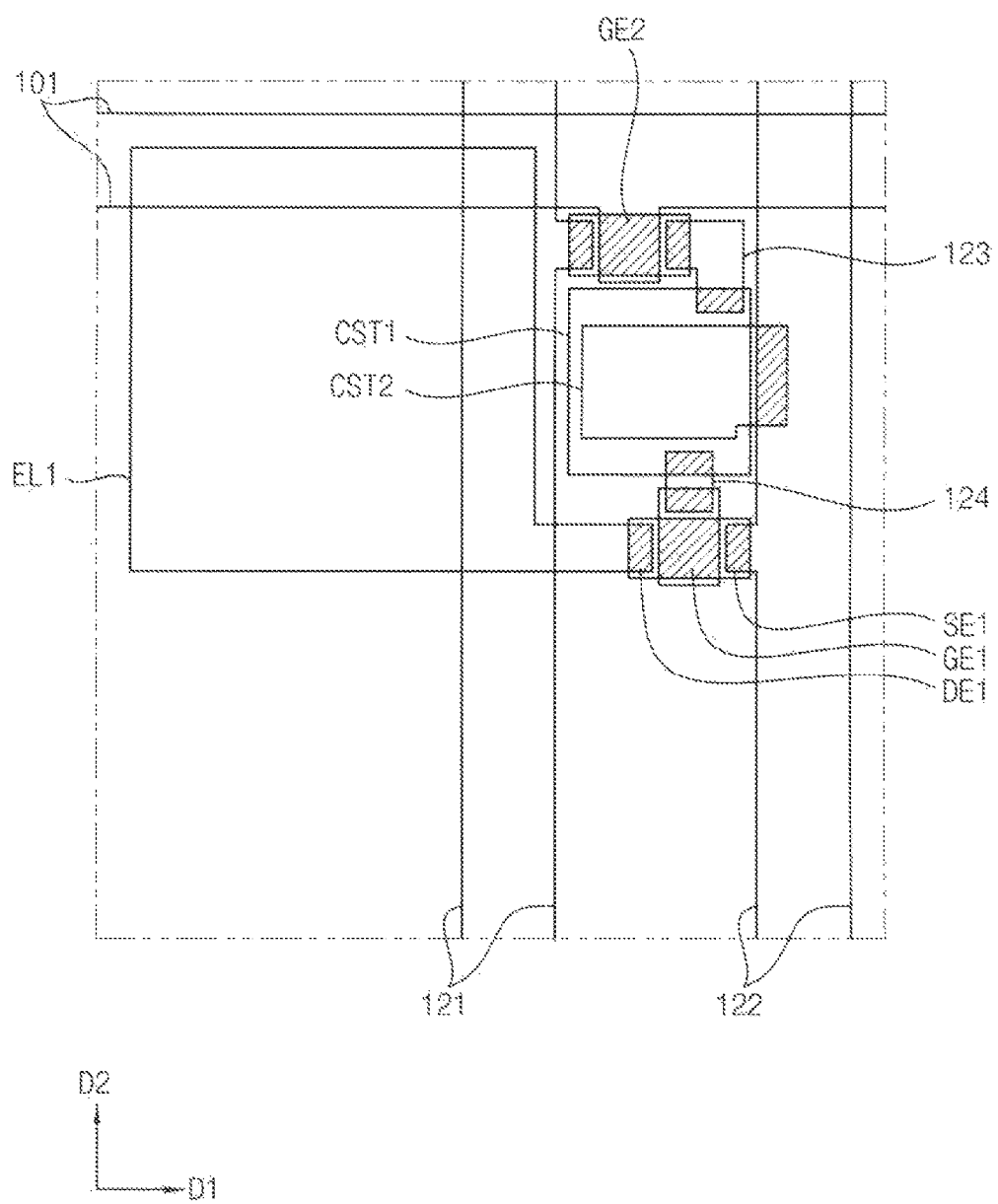
FIG. 3 is a plan view illustrating a transmitting area and a non-transmitting area of wirings of the display panel of FIG. 1.

FIG. 3 is a plan view illustrating a transmitting area and a non-transmitting area of wirings of the display panel of FIG. 1.

Referring to FIGS. 1 and 3, a plurality of openings is defined in each of a gate line 101, a data line 121, a driving power supply line 122, a first connecting electrode 123 and a second connecting electrode 124 to form a mesh structure, thereby transmitting an external light. The first electrode EL1 may include a transparent conductive material, so that the first electrode EL1 may transmit the external light. The first storage electrode CST1 may include a transparent oxide semiconductor, so that the first storage electrode CST1 may transmit the external light. The second storage electrode CST2 may include a transparent oxide semiconductor, so that the second storage electrode CST2 may transmit the external light.

A second source electrode SE2, a second gate electrode GE2, a second drain electrode DE2, a portion of a first connecting electrode 123 which is connected to the first storage electrode CST1 through a contact hole, a portion of a second connecting electrode 124 which is connected to the first storage electrode CST1 through a contact hole, a first gate electrode GE1, a portion of the second connecting electrode 124 which is connected to the first gate electrode GE1 through a contact hole, a first source electrode SE1 and a portion of the driving power supply line 122 which is connected to the second storage electrode CST2 through a contact hole may not be transparent, thereby blocking the external light. In such an embodiment, as described above, a non-transmitting area may be formed to improve characteristics of first and second transistors TR1 and TR2, or to improve electrical contact characteristics at the contact holes. A hatched area in FIG. 3 is an opaque portion which corresponds to the non-transmitting area. In an exemplary embodiment, a portion other than the non-transmitting area may be a transmitting area where the external light is transmitted.

FIG. 4 is an equivalent circuit diagram illustrating an exemplary embodiment of a pixel of the display panel of FIG. 1.

Referring to FIG. 4, the pixel may include an OLED (organic light emitting diode), a first transistor TR1, a second transistor TR2, a storage capacitor CST, and a diode parallel capacitor CEL. The diode parallel capacitor CEL may be parasitic capacitors.

The OLED may emit the light based on a driving current ID. The OLED may include a first electrode and a second electrode. In one exemplary embodiment, a second power voltage ELVSS may be applied to the second electrode of the OLED. In an exemplary embodiment, the first electrode of the OLED may be an anode electrode, and the second electrode of the OLED may be a cathode electrode. In an alternative exemplary embodiment, the first electrode of the OLED may be the cathode electrode, and the second electrode of the OLED may be the anode electrode.

The first transistor TR1 may include a gate electrode, a first electrode, and a second electrode. In an exemplary embodiment, the first electrode of the first transistor TR1 may be a source electrode, and the second electrode of the first transistor TR1 may be a drain electrode. In an alternative exemplary embodiment, the first electrode of the first transistor TR1 may be a drain electrode, and the second electrode of the first transistor TR1 may be a source electrode.

The first transistor TR1 may generate the driving current ID. In an exemplary embodiment, the first transistor TR1 may operate in a saturation region. In such an embodiment, the first transistor TR1 may generate the driving current ID based on a voltage difference between the gate electrode and the source electrode of the first transistor TR1. The grayscale may be presented based on the driving current ID provided to the OLED. In an alternative exemplary embodiment, the first transistor TR1 may operate in a linear region. In such an embodiment, the grayscale may be presented based on a time length in which the driving current ID is provided to the OLED.

The second transistor TR2 may include a gate electrode, a first electrode and a second electrode. A scan signal may be applied to the gate electrode, and a data signal may be applied to the first electrode. The second electrode may be connected to the first electrode of the first transistor TR1. In an exemplary embodiment, the first electrode of the second transistor TR2 may be a source electrode, and the second electrode of the second transistor TR2 may be a drain electrode. In an alternative exemplary embodiment, the first electrode of the second transistor TR2 may be a drain electrode, and the second electrode of the second transistor TR2 may be a source electrode.

The second transistor TR2 may provide the data signal DATA to the first electrode of the first transistor TR1 while the scan signal is activated. The second transistor TR2 may operate in the linear region.

The storage capacitor CST may include a first electrode, to which a first power voltage ELVDD is applied, and a second electrode connected to the gate electrode of the first transistor TR1. The storage capacitor CST may maintain a voltage level of the gate electrode of the first transistor TR1 while the scan signal GW is inactivated. Therefore, the driving current ID generated by the first transistor TR1 may be provided to the OLED based on the voltage level maintained by the storage capacitor CST.

A voltage difference between both electrodes of the OLED may be lower than a threshold voltage of the OLED when the OLED does not emit the light. The OLED may emit the light when the voltage difference is higher than the threshold voltage. Therefore, the voltage difference may reach to the threshold voltage and the light may be emitted when a threshold capacitance is charged in the diode parallel capacitor CEL. The threshold capacitance may be calculated according to the following Equation: $Qc = CEL \times Vth$, in which Qc denotes the threshold capacitance, CEL denotes the capacitance of the diode parallel capacitor, Vth denotes the threshold voltage of the OLED.

In an exemplary embodiment, the driving current ID may not be zero by a leakage current generated from the first transistor TR1 when the OLED presents a black color light (i.e., the grayscale is zero). However the leakage current may flow through the diode parallel capacitor CEL instead of the OLED until the voltage difference between both electrodes of the OLED reach to the threshold voltage. The OLED may not emit the light while the diode parallel capacitor CEL is charged by the leakage current until the threshold capacitance. Thus, when a time length not to emit the light in one frame is determined, voltage level of the initialization voltage, capacitance of the diode parallel capacitor may be adjusted, so that OLED may not emit the light during the one frame.

Figure 5:
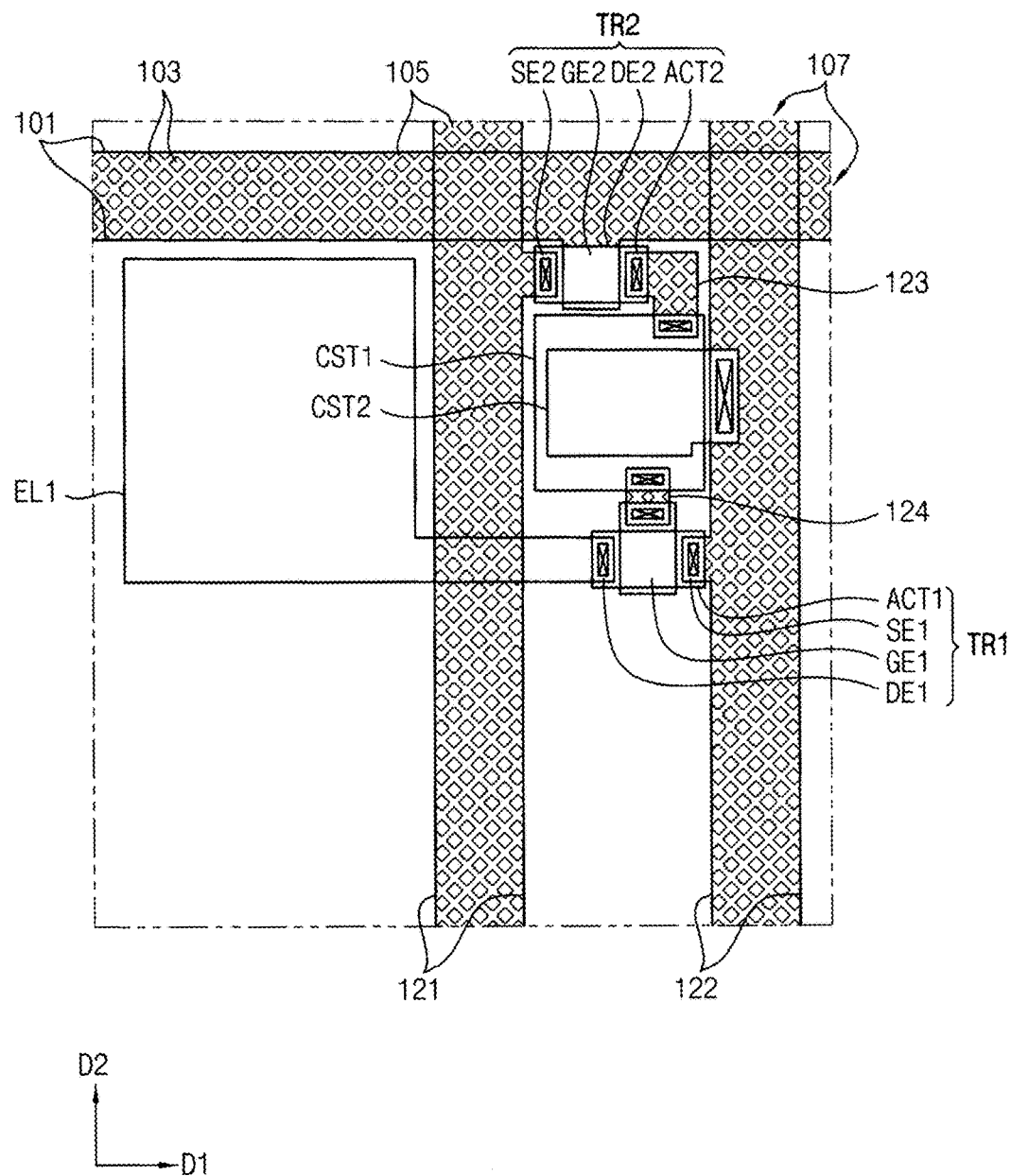
FIG. 5 is a plan view illustrating a display panel according to an alternative exemplary embodiment of the inventive concept.

FIG. 5 is a plan view illustrating a display panel according to an alternative exemplary embodiment of the inventive concept.

The display panel shown in FIG. 5 is substantially same as the display panel of FIG. 1 except for a shape of a first electrode EL1. The same or like elements shown in FIG. 5 have been labeled with the same reference characters as used above to describe the exemplary embodiments of the display panel shown in FIG. a, and any repetitive detailed description thereof will hereinafter be omitted or simplified.

In an exemplary embodiment, the display panel may include a gate pattern, an active pattern, a data pattern, first and second transistors TR1 and TR2, and a transparent pattern. The gate pattern may include a gate line 101, a first gate electrode GE1 and a second gate electrode GE2. The active pattern may include a first active pattern ACT1, a second active pattern ACT2, and a first storage electrode CST1. The data pattern may include a data line 121, a second source electrode SE2, a second drain electrode DE2, a first connecting electrode 123, a driving power supply line 122, a first source electrode SE1 and a second connecting electrode 124. The first transistor TR1 may include the first gate electrode GE1, the first active pattern ACT1, the first source electrode SE1 and the first drain electrode DE1. The second transistor TR2 may include the second gate electrode GE2, the second active pattern ACT2, the second source electrode SE2 and the second drain electrode DE2.

The transparent pattern may include a first electrode ELL and a second storage electrode CST2.

The first electrode EL1 may include a transparent conductive material. The first electrode EL1 may be disposed not to overlap the gate line 101. In such an embodiment, the first electrode EL1 may be disposed to minimize an overlapping portion with the data line 101 or the driving power supply line 122. In one exemplary embodiment, for example, a portion of the first electrode EL1 which is connected to a first drain electrode DE1 may overlap the data line 121.

In an exemplary embodiment, the first electrode EL1 may have a multi-layer structure. In one exemplary embodiment, for example, the first electrode EL1 may have a structure in which ITO, silver (Ag) and ITO are sequentially stacked one on another.

In one exemplary embodiment, a second electrode (refers to EL2 of FIG. 2) may include transflective material. In one exemplary embodiment, for example, the second electrode may include a transflective film including silver (Ag) or Magnesium (Mg).

FIGS. 6A to 14 are plan views and cross-sectional views illustrating an exemplary embodiment of a method of manufacturing the display panel of FIG. 1.

Figure 6A:
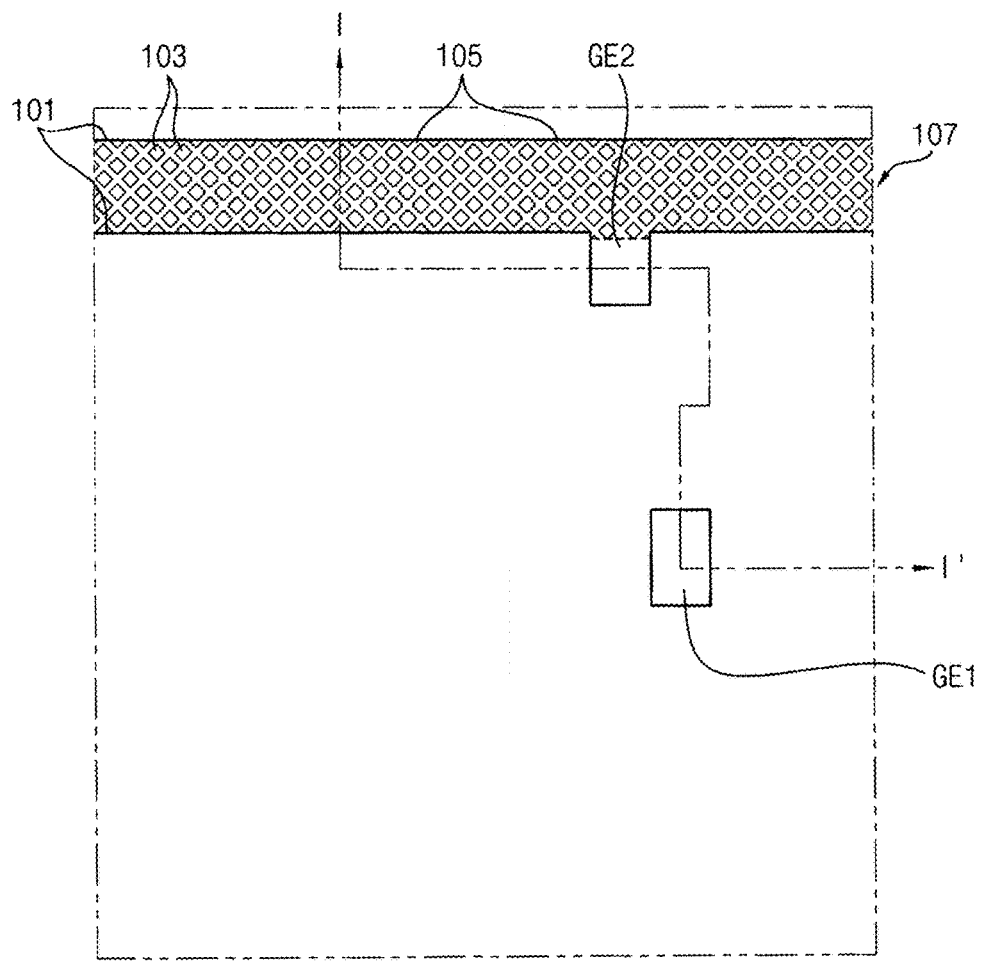
FIGS. 6A to 14 are plan views and cross-sectional views illustrating an exemplary embodiment of a method of manufacturing the display panel of FIG. 1.
Figure 6B:
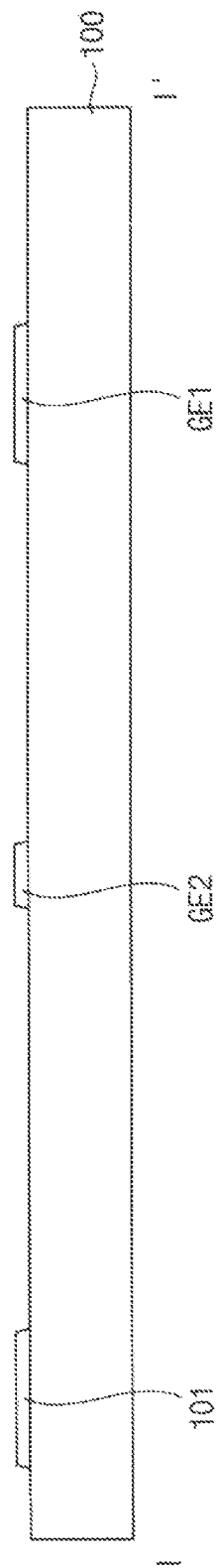

Referring to FIGS. 6A and 6B, in an exemplary embodiment, a gate pattern may be provided or formed on a base substrate 100. In such an embodiment, the gate pattern may include a gate line 101, a first gate electrode GE1 and a second gate electrode GE2.

In an exemplary embodiment, a conductive layer (not illustrated) may be provided or formed on the base substrate 100, and the conductive layer may be partially etched by a photolithography process or an etching process using an additional etching mask. In such an embodiment, the gate pattern may be defined by the etched conductive layer on the base substrate 100. In an exemplary embodiment, the conductive layer may be formed by a printing process, a sputtering process, a chemical vapor deposition ("CVD") process, a pulsed laser deposition ("PLD") process, a vacuum evaporation process, an atomic layer deposition ("ALD") process, or the like.

The gate line 101 may extend in a first direction D1. A plurality of openings may be formed at substantially an entire region of the gate line 101.

The openings may be formed by various methods. In one exemplary embodiment, for example, the openings may be formed by photo lithography, imprint lithography, or etc. In an exemplary embodiment, the openings may be formed at the same time when the conductive layer is etched. In an alternative exemplary embodiment, the openings may be formed by an additional process after forming the gate pattern.

The first gate electrode GE1 may be spaced apart from the gate line 101. The openings are not formed at the first gate electrode GE1. The first gate electrode GE1 may be a conventional metal pattern.

The second gate electrode GE2 may be electrically connected to the gate line 101. The openings are not formed at the second gate electrode GE2. The second gate electrode GE2 may be a conventional metal pattern.

Figure 7A:
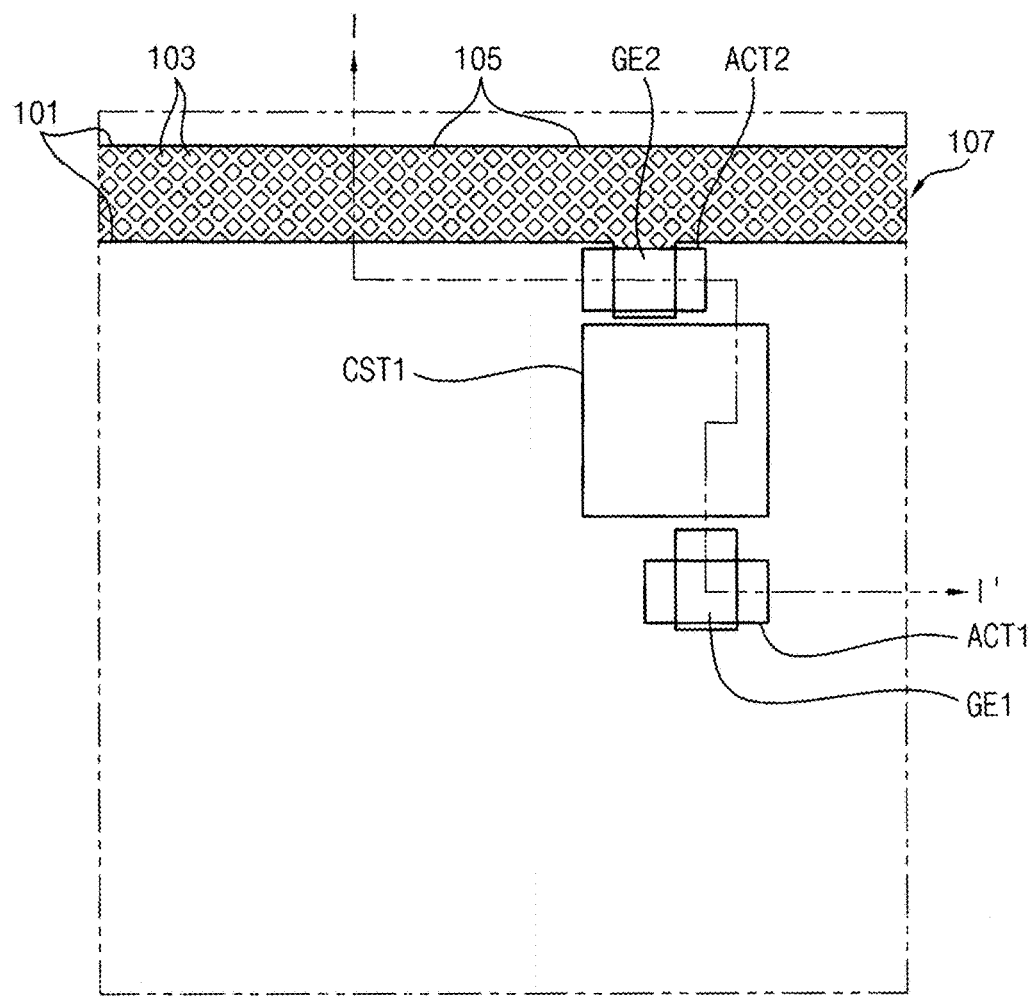
Figure 7B:
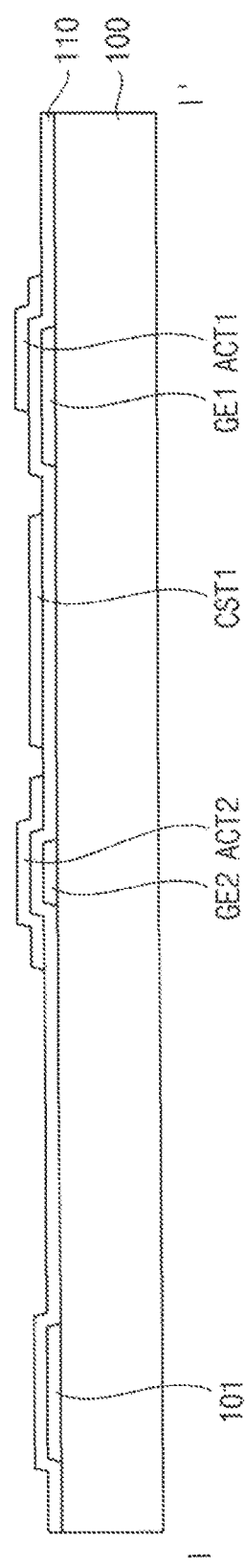

Referring to FIGS. 7A and 7B, a first insulation layer 110 may be provided or formed on the base substrate 100 on which the gate pattern is formed. The first insulation layer 110 may be formed by a CVD process, a spin coating process, a plasma enhanced chemical vapor deposition ("PECVD") process, a sputtering process, a vacuum evaporation process, an high density plasma-chemical vapor deposition ("HDP-CVD") process, a printing process, or the like.

An active pattern may be formed on the first insulation layer 110. The active pattern may include a first active pattern ACT1, a second active pattern ACT2, and a first storage electrode CST1.

A semiconductor layer (not illustrated) may be formed on the first insulation layer 110, and a preliminary active layer (not illustrated) may be formed on the first insulation layer 110 by patterning the semiconductor layer. The crystallization process may be performed on the preliminary active layer to form the active pattern on the first insulation layer 110. In an exemplary embodiment, the semiconductor layer may be formed by a CVD process, a PECVD process, a low pressure chemical vapor deposition ("LPCVD") process, a sputtering process, a printing process, or the like. The active pattern may include an oxide semiconductor which is transparent. In one exemplary embodiment, for example, the oxide semiconductor may include an amorphous oxide including at least one selected from indium (In), zinc (Zn), gallium (Ga), tin (Sn) and hafnium (Hf). In an exemplary embodiment, the oxide semiconductor may include or be consist of an amorphous oxide including indium (In), zinc (Zn) and gallium (Ga), or an amorphous oxide including indium (In), zinc (Zn) and hafnium (Hf). The oxide semiconductor may include an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO).

A portion of the active pattern may be doped by an impurity, so that the portion may have a higher electrical conductivity than other region of the active pattern.

The first active pattern ACT1 may be provided to overlap the first gate electrode GE1. The second active pattern ACT2 may be provided to overlap the second gate electrode GE2.

The first storage electrode CST1 may be provided to be spaced apart from the first active pattern ACT1 and the second active pattern ACT2. The first storage electrode CST1 may have a hydrogen concentration higher than that of the first active pattern ACT1 and the second active pattern ACT2. When the hydrogen concentration is increased, carrier concentration also increases, so that the first storage electrode CST1 may be effectively used as a lower electrode of a storage capacitor.

Figure 8A:
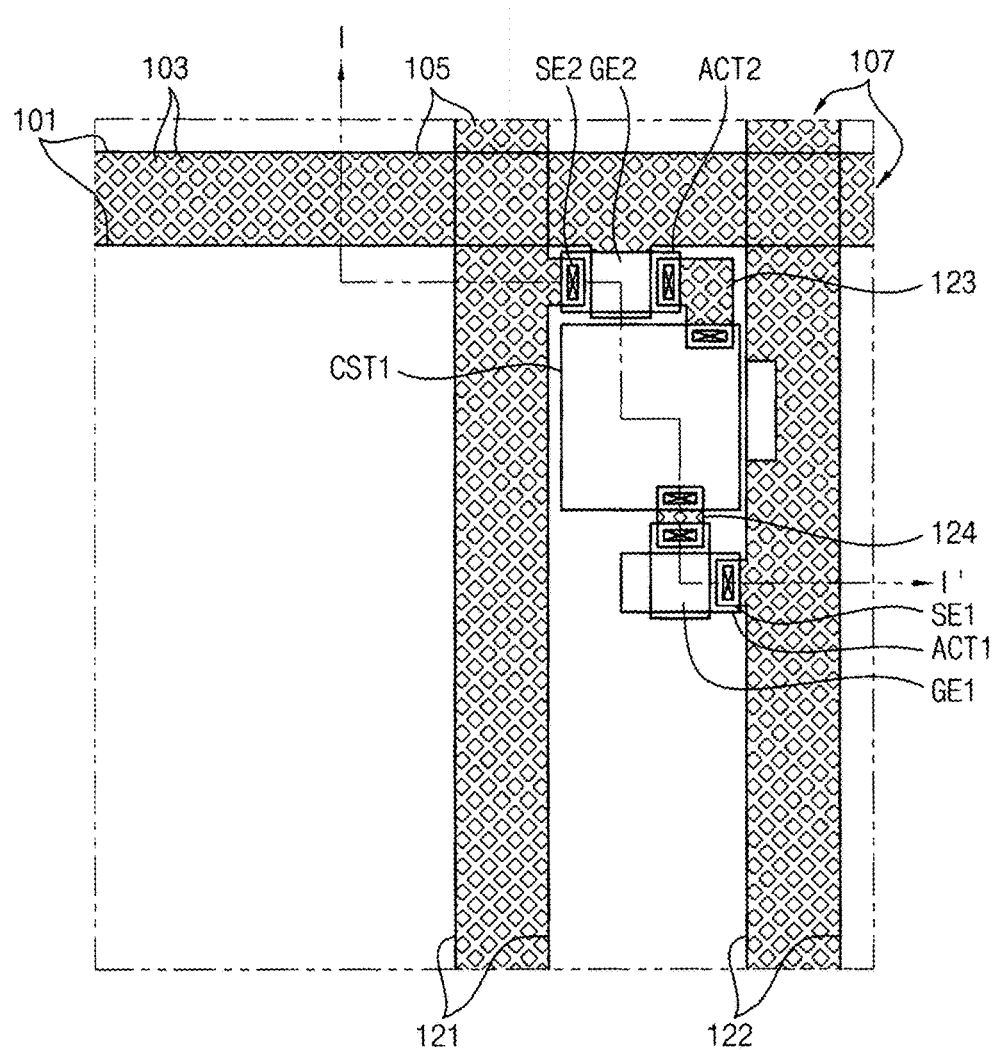
Figure 8B:
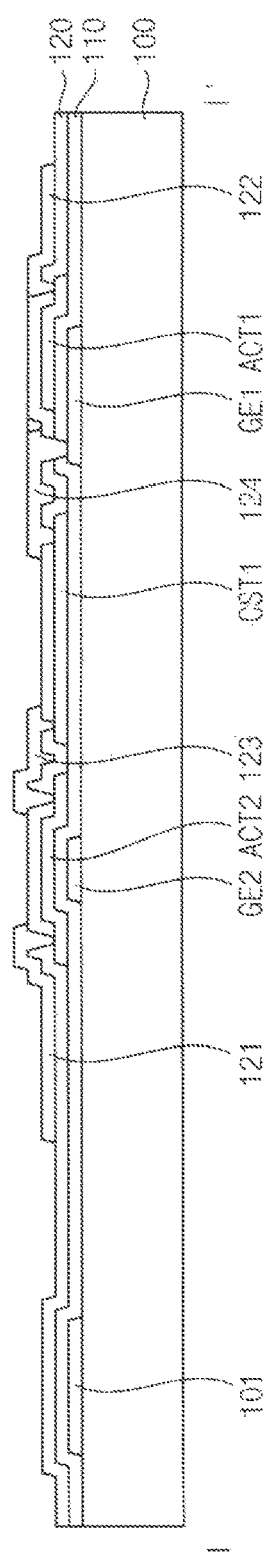

Referring to FIGS. 8A and 8B, a second insulation layer 120 may be provided or formed on the first insulation layer 110 on which the active patter is formed. The second insulation layer 120 may be formed by a CVD process, a spin coating process, a PECVD process, a sputtering process, a vacuum evaporation process, an HDP-CVD process, a printing process, or the like.

Contact holes which expose the active pattern or the gate pattern may be defined or formed through the second insulation layer 120.

A data pattern may be provided or formed on the second insulation layer 120. The data pattern may include a data line 121, a second source electrode SE2, a second drain electrode DE2, a first connecting electrode 123, a driving power supply line 122, a first source electrode SE1 and s second connecting electrode 124.

In an exemplary embodiment, a conductive layer (not illustrated) may be formed on the second insulation layer 120, and the conductive layer may be partially etched by a photolithography process or an etching process using an additional etching mask. In such an embodiment, the data pattern may be defined by the etched conductive layer on the second insulation layer 120. The conductive layer may be formed by a printing process, a sputtering process, a CVD process, a PLD process, a vacuum evaporation process, an ALD process, or the like.

The data line 121 may extend in a second direction D2 which crosses the first direction D1. A plurality of openings may be formed at substantially an entire region of the data line 121.

The openings may be formed by photo lithography, imprint lithography, or the like. In an exemplary embodiment, the openings may be formed at the same time when the conductive layer is etched. In an alternative exemplary embodiment, the openings may be formed by an additional process after forming the data pattern.

The first source electrode SE1 may be connected to the driving power supply line 122. The openings are not formed at the second source electrode SE1. The second source electrode SE1 may be a conventional metal pattern.

The second source electrode SE2 may be connected to the data line 121. The openings are not formed at the second source electrode SE2. The second source electrode SE2 may be a conventional metal pattern.

The driving power supply line 122 may be provided to be spaced apart from the data line 121 in the first direction D1, and to extend in the second direction D2. A plurality of openings may be formed at substantially an entire region of the driving power supply line 122.

The openings may be formed by photo lithography, imprint lithography, or the like. In an exemplary embodiment, the openings may be formed at the same time when the conductive layer is etched. In an alternative exemplary embodiment, the openings may be formed by an additional process after forming the data pattern.

Figure 9A:
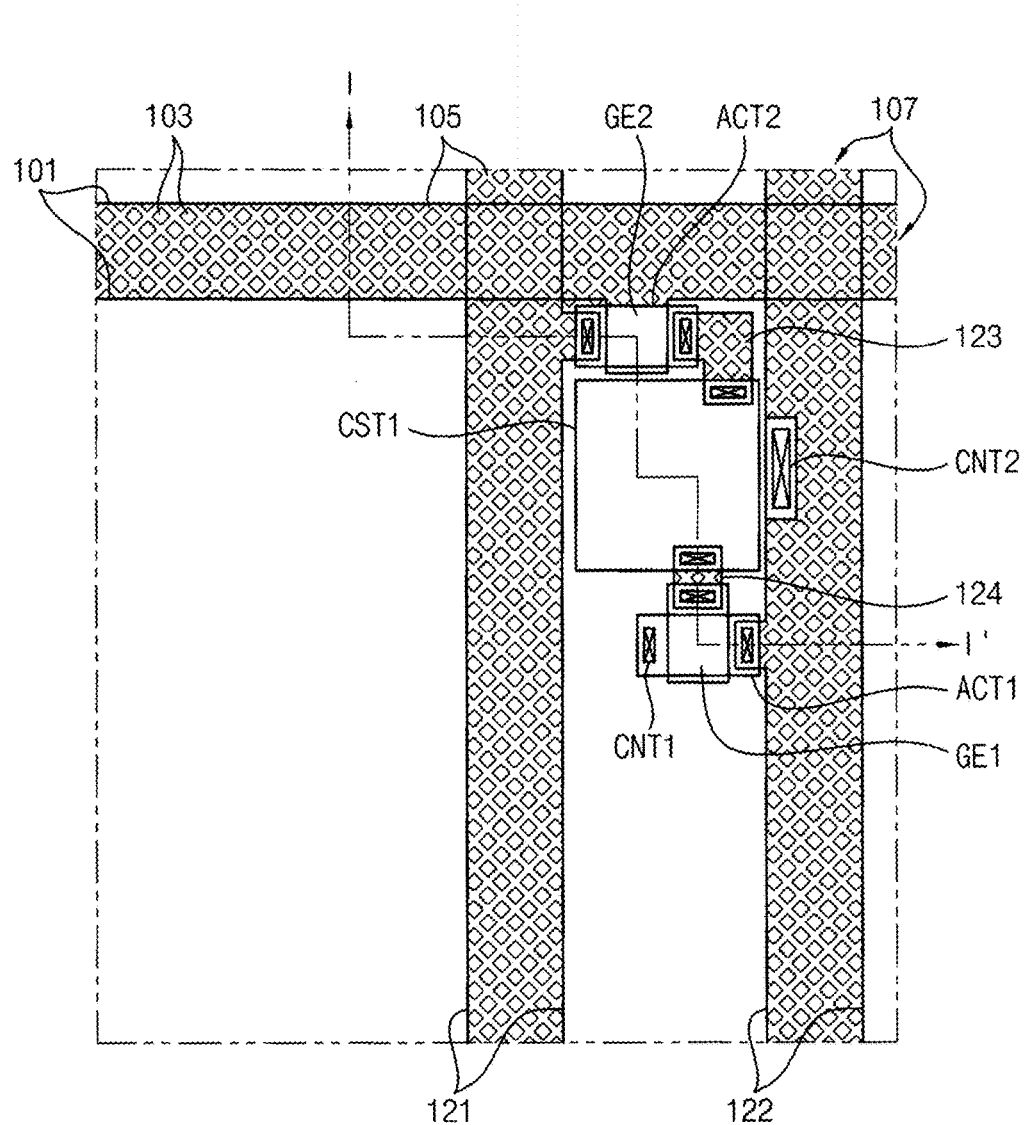
Figure 9B:
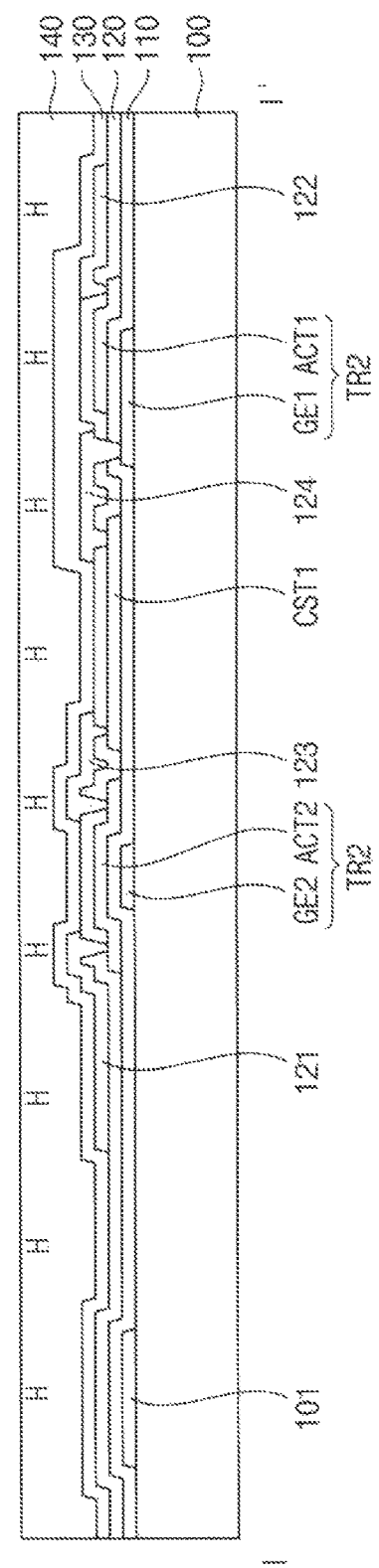

Referring to FIGS. 9A and 9B, a third insulation layer 130 may be provided or formed on the second insulation layer 120 on which the data pattern is formed. The third insulation layer 130 may be formed by a CVD process, a spin coating process, a PECVD process, a sputtering process, a vacuum evaporation process, an HDP-CVD process, a printing process, or the like.

Subsequently, a fourth insulation layer 140 may be formed on the third insulation layer 130. The fourth insulation layer 140 may be formed by a spin coating process, a printing process, a sputtering process, a CVD process, an ALD process, PECVD process, a HDP-CVD process, a vacuum evaporation process or the like, according to constituents of the fourth insulation layer 140. In exemplary embodiments, a planarization process may be executed on the fourth insulation layer 140 to enhance the flatness of the fourth insulation layer 140. In one exemplary embodiment, for example, the fourth insulation layer 140 may have a substantially level surface by a chemical mechanical polishing ("CMP") process, an etch-back process, or the like. The fourth insulation layer 140 may be formed using an organic material.

Subsequently, a first contact hole CNT1, which exposes the driving power supply line 122 through the third and fourth insulation layers 130 and 140, and a second contact hole CNT2 which exposes the first active pattern ACT1 though the second to fourth insulation layers 120, 130 and 140, may be formed.

Subsequently, the fourth insulation layer 140 may be cleaned by using cleaning fluid including hydrogen to remove etch by-product and contaminants. Here, water (H2O) may be used as the cleaning fluid to clean the fourth insulation layer 140 which is formed with the organic material, so that hydrogen may be efficiently permeated to the fourth insulation layer 140.

Figure 10A:
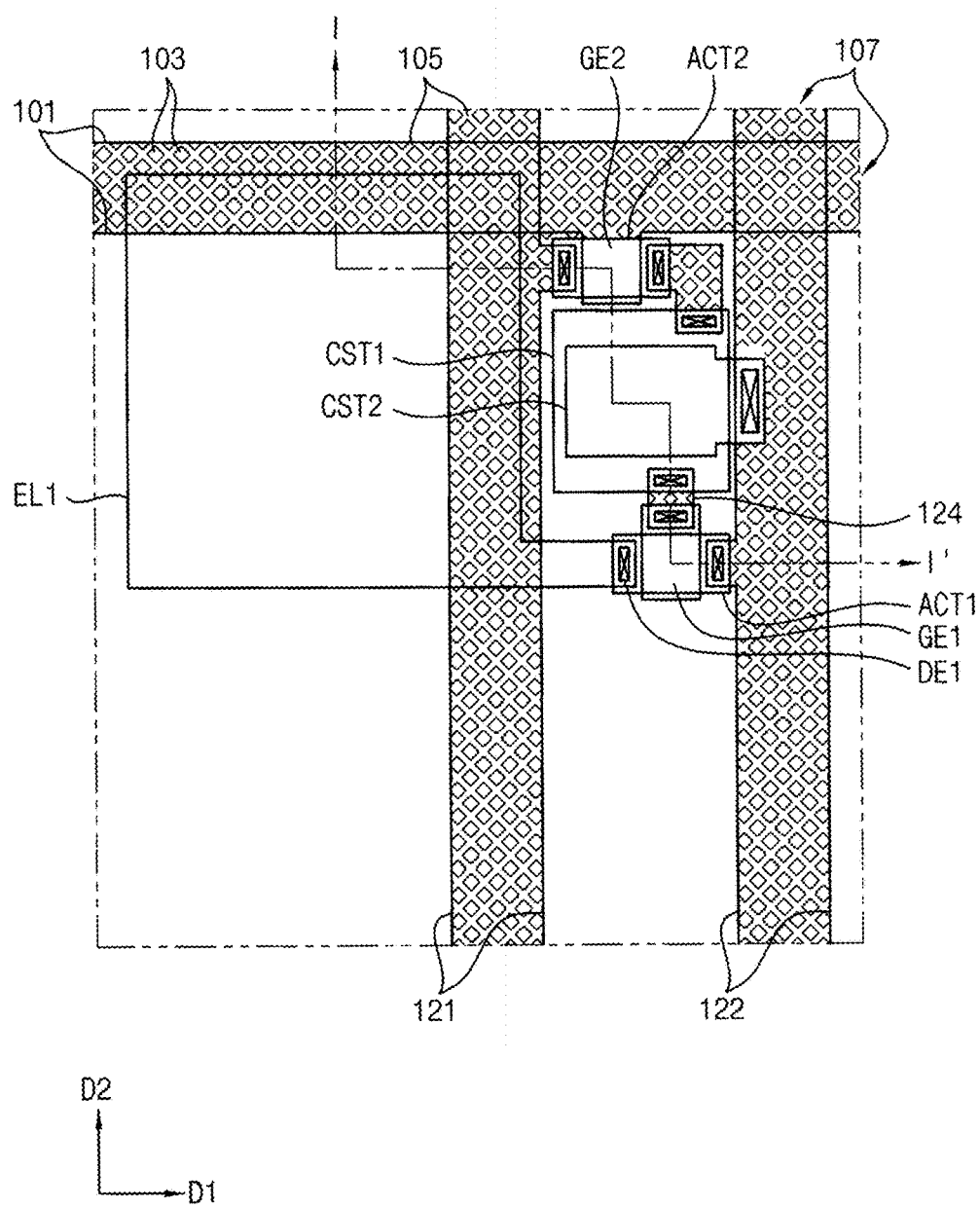
Figure 10B:
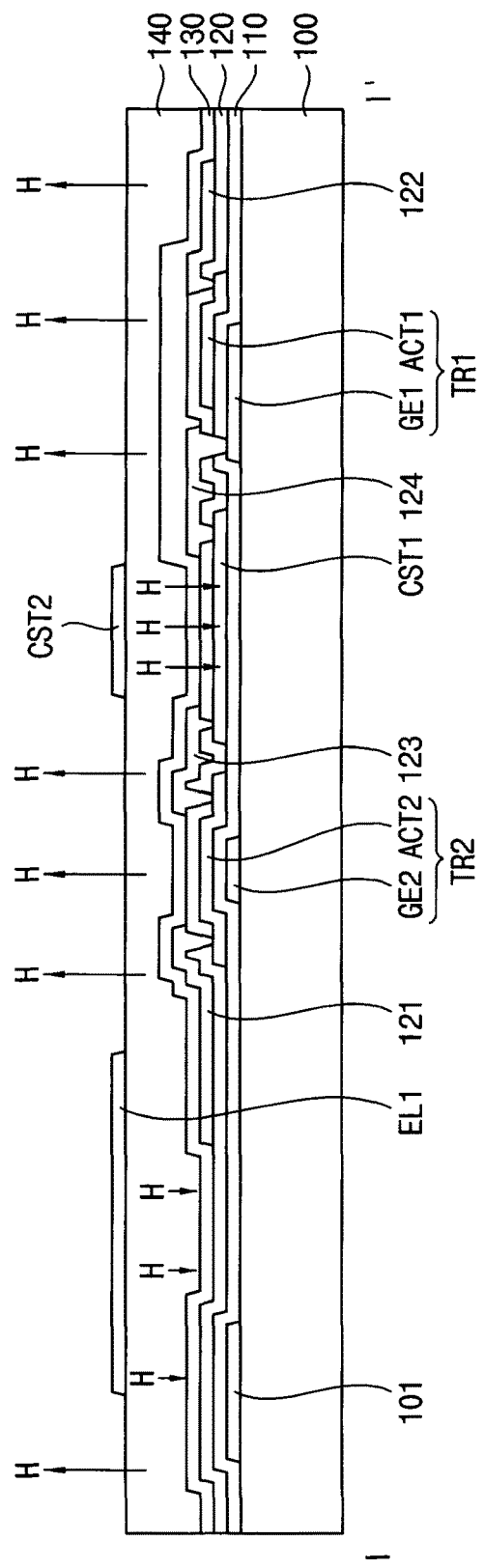

Referring to FIGS. 10A and 10B, a transparent pattern may be provided or formed on the fourth insulation layer 140. In an exemplary embodiment, a transparent conductive layer (not shown) may be formed on the fourth insulation layer 140, and the transparent conductive layer may be partially etched by a photolithography process or an etching process using an additional etching mask. In such an embodiment, the transparent pattern may be defined by the etched transparent conductive layer formed on the fourth insulation layer 140.

The transparent pattern may include a first electrode EL1 and a second storage electrode CST2.

The first electrode EL1 may be disposed to overlap a portion of the gate pattern and a portion of the data pattern. In one exemplary embodiment, for example, the first electrode EL1 may be disposed to overlap a portion of the gate line 101, and overlap a portion of the data line 121. The first drain electrode DE1 may be electrically connected to first active pattern ACT1 through contact holes defined or formed through the second to fourth insulation layers 120, 130 and 140. The first drain electrode DE1 may be electrically connected to the first electrode EL1. The first drain electrode DE1 may be defined by a portion of the first electrode EL1.

The second storage electrode CST2 may be provided to overlap the first storage electrode CST1. The second storage electrode CST2 may be electrically connected to the driving power supply line 122 through a contact hole defined or formed through the third and fourth insulation layers 130 and 140.

During a subsequent manufacturing process of those described above, the hydrogen in the fourth insulation layer 140 may be diffused to outside. The hydrogen under the second storage electrode CST2 may not be diffused to outside, but diffused toward the first storage electrode CST1, so that hydrogen concentration of the oxide semiconductor. When the hydrogen concentration is increased, carrier concentration also increases, so that the first storage electrode CST1 may be used as a lower electrode of a storage capacitor.

In such an embodiment, further heat treatment process may be performed to diffuse the hydrogen.

Figure 11:
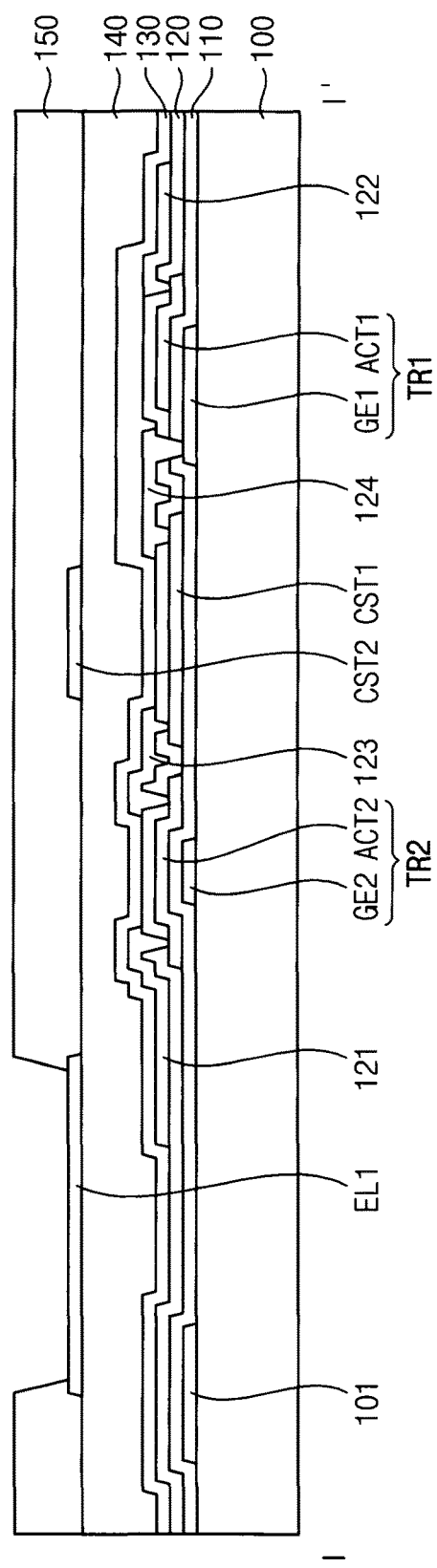

Referring to FIG. 11, a pixel defining layer 150 may be provided or formed on the fourth insulation layer 140 on which the transparent pattern is formed. The pixel defining layer 150 may include an organic material or an inorganic material. In one exemplary embodiment, for example, the pixel defining layer 150 may be formed using at least one of photoresist, acryl-based resin, polyacryl-based resin, polyimide-based resin, and a silicon compound. The pixel defining layer 150 may be obtained by a spin coating process, a spray process, a printing process, a CVD process, a PECVD process, an HDP-CVD process, or the like.

In some exemplary embodiment, an opening which exposes a portion of the first electrode EL1 may be formed by etching the pixel defining layer 150. The pixel defining layer 150 may include organic or inorganic material which is transparent. In one exemplary embodiment, for example, the pixel defining layer 150 may be formed using at least one of photoresist, acryl-based resin, polyacryl-based resin, polyimide-based resin, or a silicon compound.

Figure 12:
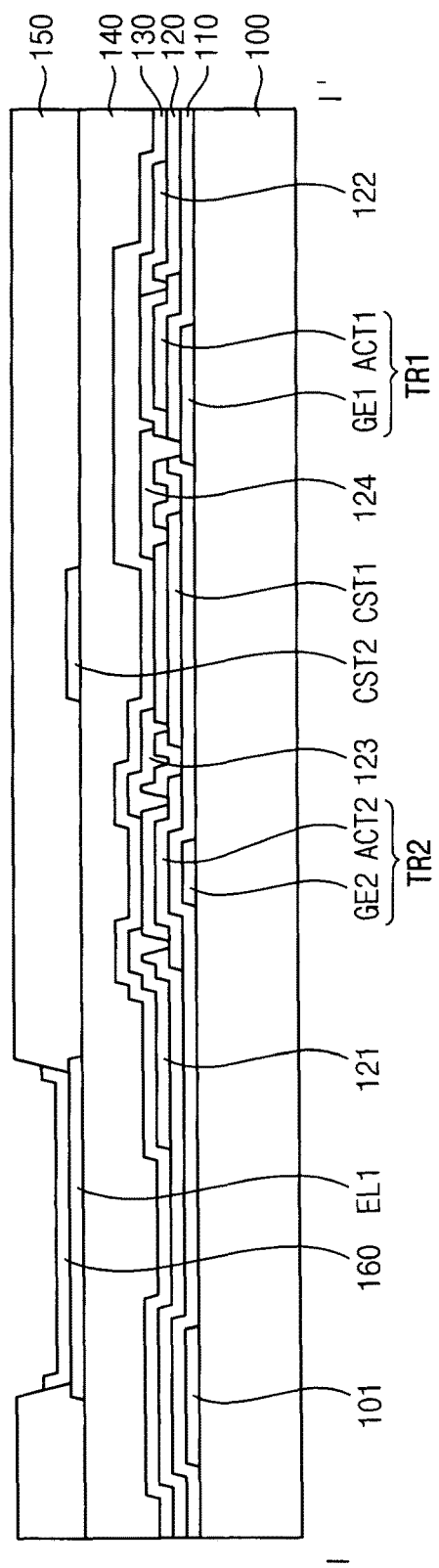

Referring to FIG. 12, a light emitting structure 160 may be provided or formed on a portion of the first electrode EL1 exposed by the opening of the pixel defining layer 150. In an exemplary embodiment, the light emitting structure 160 may extend on a sidewall of the opening of the pixel defining layer 150. The light emitting structure 160 may be formed by a laser induced thermal imaging process, a printing process, or the like. In such an embodiment, as described above, the light emitting structure 160 may include an organic light EL, a HIL, a HTL, an ETL, or an EIL.

Figure 13:
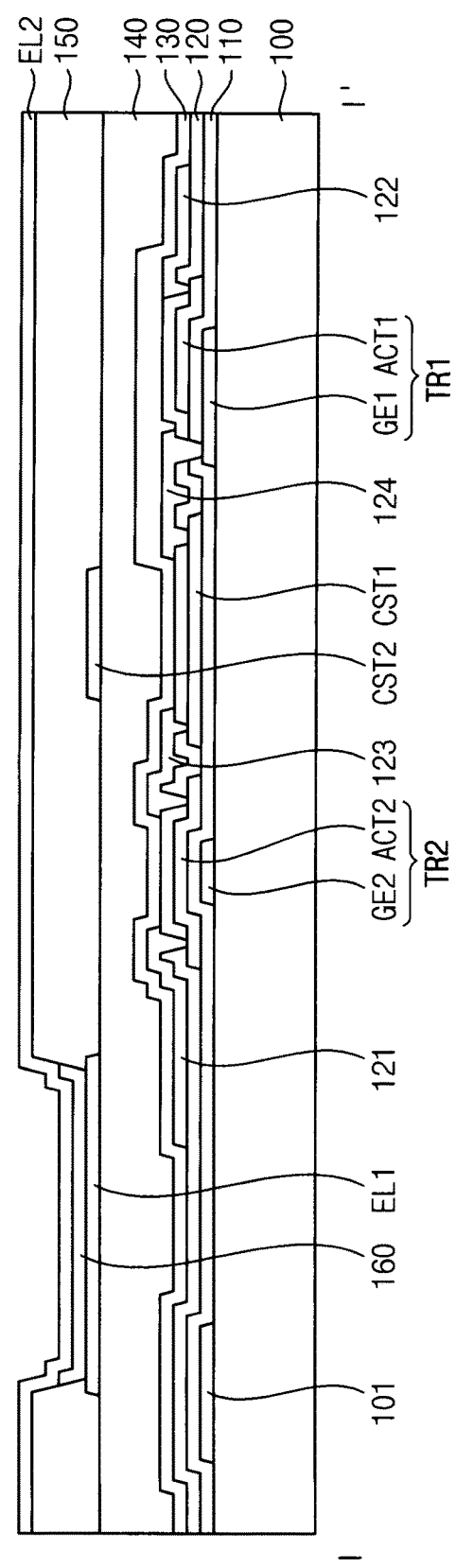

Referring to FIG. 13, a second electrode EL2 may be provided or formed on the pixel defining layer 150 and the light emitting structure 160. The second electrode EL2 may be formed by a printing process, a sputtering process, a CVD process, an ALD process, a vacuum evaporation process, a PLD process, or the like.

A sealing substrate 200 may be provided or formed on the second electrode EL2. The sealing substrate 200 may include transparent material. The sealing substrate 200 may be combined to the base substrate 100 to seal space between the base substrate 100 and the sealing substrate 200 by a sealing agent (not shown).

Figure 14:
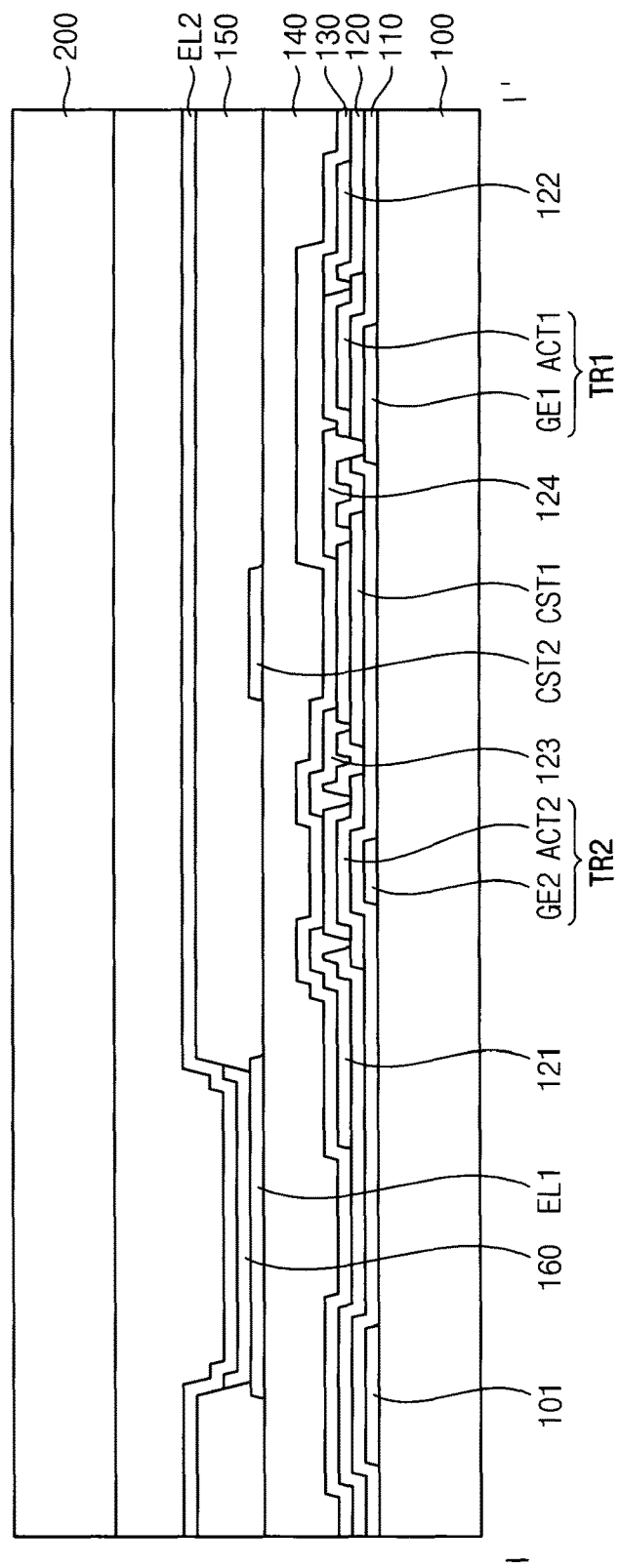

Referring to FIG. 14, a desiccant or a filler may be filled into the space. A thin sealing film instead of the sealing substrate 200 may be formed on the second electrode EL2. In an exemplary embodiment, the sealing film has a structure, in which a layer formed of an inorganic material such as silicon oxide or silicon nitride and a layer such as epoxy or polyimide are alternately stacked, but not being limited thereto. In an alternative exemplary embodiment, the structure of the sealing film may be one of any sealing structure in the form of a transparent thin film.

According to exemplary embodiments of the inventive concept, a display panel includes signal lines in which a plurality of openings is defined, so that transparency may be improved. It will be recognized by those skilled in the art that the "signal line "claimed herein includes, but is not limited to, the gate lines 101, data lines 121, driving power supply line 122, first and second connecting electrodes 123, 124 discussed above. Further, it will be recognized by those skilled in the art that the claimed "plurality of opening" with respect to the claimed "signal line" is shown with referencecharacter" 103in FIGS 1, 5, 6A, 7A, 8A, 9A and 10A as being defined by a plurality of fine lines 105 disposed in a way, such that the fine lines from repeated X shapes defined by the crossing fine lines 105 to define a mesh structure 107 defining the "signal lines" including the gate lines 101 and data lines 121 shown in FIGS, 1, 5, 6A, 7A, 8A, 9A and 10A. The fine lines 105 may have a width less than 2.0 micrometer (μm) to be invisible to a user. Accoring, the signal line in the mesh 107 may effectively transmit the external light through the openings 103 depicted as square diamonds in FIGS. 1, 5, 6A, 7A, 8A, 9A and 10A for example, but not limited to this structure, as disclosed above. In such embodiments, the display panel may include a second storage electrode including an oxide semiconductor which is transparent and include a second storage electrode which is a transparent pattern such that that transmittance of an external light corresponding to where a storage capacitor is formed is improved.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the invention as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display panel comprising:
   a signal line extending in at least one of a first direction and a second direction, which crosses the first direction, in a top plan view;
   a first transistor electrically connected to the signal line, and comprising a first active pattern and a first gate electrode; and
   a first electrode electrically connected to the first transistor,
   wherein a plurality of openings are defined in the signal line at least along a substantial length defining the signal line, the plurality of openings are dimensioned and configured to transmit an external light therethrough and outside of the display panel to improve transparency through the display panel.

2. The display panel of claim 1, wherein the signal line comprises:
   a gate line extending in the first direction;
   a data line extending in the second direction; and
   a driving power supply line extending in the second direction and spaced apart from the data line.

3. The display panel of claim 2, wherein each of the gate line, the data line and the driving power supply line has a mesh structure which defines the openings.

4. The display panel of claim 3, wherein the mesh structure is defined by a plurality of fine lines which make repeated X shapes.

5. The display panel of claim 4, wherein the fine lines have a width less than about 2.0 micrometers.

6. The display panel of claim 5, wherein
   the first gate electrode is electrically connected to the gate line, and no opening is defined in the first gate electrode, so that the first gate electrode blocks the external light.

7. The display panel of claim 1, wherein
the first electrode comprises a transparent conductive material, and
a portion of the first electrode overlaps the signal line.

8. The display panel of claim 1, wherein the first active pattern comprises an oxide semiconductor which is transparent.

9. The display panel of claim 8, further comprising:
a first storage electrode, and a second storage electrode, which define a storage capacitor,
wherein
the first storage electrode comprises the oxide semiconductor which is transparent, and
the second storage electrode comprises a transparent conductive material.

10. The display panel of claim 9, wherein
the first storage electrode and the active pattern are defined by a same layer, and
each of the first storage electrode and the active pattern has a hydrogen concentration higher than a hydrogen concentration of the first active pattern.

11. The display panel of claim 10, further comprising:
an insulation layer comprising an organic material and between the first storage electrode and the second storage electrode.

12. The display panel of claim 10, further comprising:
a first insulation layer and a second insulation layer, which are between the first storage electrode and the second storage electrode,
wherein
the first insulation layer comprises an inorganic material, and
the second insulation layer comprises an organic material.

13. The display panel of claim 9, wherein the second storage electrode and the first electrode are defined by a same layer.

14. The display panel of claim 1, further comprising:
a pixel defining layer on the first electrode and comprising a transparent material, wherein an opening which exposes a portion of the first electrode is defined in the pixel defining layer.

15. The display panel of claim 1, further comprising:
a plurality of insulation layers which insulates the signal line, the first transistor and the first electrode from each other,
wherein the signal line, the first transistor and the first electrode are electrically connected to each other through contact holes defined through the insulation layers,
no opening is defined in at a portion of the signal line and the first transistor where the signal line and the first transistor are connected through the contact hole and at a portion of the first transistor and the first electrode where the transistor and the first electrode are connected through the contact hole, such that the portion of the signal line and the first transistor and the portion of the first transistor and the first electrode are not transparent.

16. A display panel comprising:
a signal line comprising a metal;
a first electrode comprising a transparent conductive material and electrically connected to the signal line; and
a light emitting structure on the first electrode,
wherein a plurality of openings is defined in the signal line at least along a substantial length defining the signal line, the plurality of openings are dimensioned and configured to transmit an external light therethrough and outside of the display panel to improve transparency through the display panel.

* * * * *